(12) United States Patent
Makosiej

(10) Patent No.: US 12,374,374 B2
(45) Date of Patent: Jul. 29, 2025

(54) PRECHARGE CIRCUITRY FOR MEMORY

(71) Applicant: XENERGIC AB, Lund (SE)

(72) Inventor: Adam Makosiej, Janowka (PL)

(73) Assignee: XENERGIC AB, Lund (SE)

( * ) Notice: Subject to any disclaimer, the term of this patent is extended or adjusted under 35 U.S.C. 154(b) by 117 days.

(21) Appl. No.: 17/998,612

(22) PCT Filed: May 12, 2021

(86) PCT No.: PCT/EP2021/062646
§ 371 (c)(1),
(2) Date: Nov. 11, 2022

(87) PCT Pub. No.: WO2021/228953
PCT Pub. Date: Nov. 18, 2021

(65) Prior Publication Data
US 2023/0154506 A1    May 18, 2023

(30) Foreign Application Priority Data

May 12, 2020  (EP) ..................... 20174140

(51) Int. Cl.
*G11C 7/00* (2006.01)
*G11C 7/12* (2006.01)
(52) U.S. Cl.
CPC ............ *G11C 7/12* (2013.01); *G11C 2207/12* (2013.01)
(58) Field of Classification Search
CPC ...................................... G11C 7/12
(Continued)

(56) References Cited

U.S. PATENT DOCUMENTS 5,771,190 A    6/1998  Okamura
6,301,179 B1  10/2001  Lawson
(Continued)

FOREIGN PATENT DOCUMENTS

EP       2211352      7/2010
JP       H01173384 A  7/1989
(Continued)

OTHER PUBLICATIONS

International Search Report & Written Opinion to corresponding PCT Application No. PCT/EP2021/062646 dated Sep. 9, 2022.

*Primary Examiner* — Hoai V Ho
(74) *Attorney, Agent, or Firm* — Dinsmore & Shohl LLP

(57) ABSTRACT

The present disclosure relates to a precharge circuitry for bit lines of an array of memory cells, the precharge circuitry comprising a precharge and limiting unit configured to precharge a first bit line and a second bit line, the precharge and limiting unit further configured to limit a first bit line precharge level of the first bit line and a second bit line precharge level of the second bit line during a precharge cycle of a read and/or write operation of any of the memory cells, wherein the precharge and limiting unit is configured to limit the first bit line precharge level and the second bit line precharge level in a single precharge cycle, preferably without substantial delay. The disclosure further relates to a memory comprising a plurality of memory cells arranged in columns and rows, and at least one precharge circuit, wherein the precharge circuit is connected to a first bit line and a second bit line of all memory cells within a column, wherein each precharge circuit is configured to limit the first bit line to a first bit line precharge level and the second bit line to a second bit line precharge level during a precharge cycle.

19 Claims, 12 Drawing Sheets

(58) Field of Classification Search
USPC .......................................................... 365/203
See application file for complete search history.

(56) References Cited

U.S. PATENT DOCUMENTS

| | | | |
|---|---|---|---|
| 6,343,038 B1* | 1/2002 | Makino | G11C 7/12 |
| | | | 365/194 |
| 2003/0156487 A1* | 8/2003 | Izutsu | G11C 29/12 |
| | | | 365/230.03 |
| 2005/0213371 A1 | 9/2005 | Kimura | |
| 2007/0247885 A1 | 10/2007 | Watanabe et al. | |
| 2013/0148415 A1 | 6/2013 | Shu et al. | |
| 2015/0063007 A1* | 3/2015 | Choi | G11C 11/419 |
| | | | 365/154 |
| 2017/0243633 A1 | 8/2017 | Fritsch et al. | |
| 2018/0350429 A1 | 12/2018 | Jeong | |
| 2020/0012562 A1 | 1/2020 | Lea et al. | |

FOREIGN PATENT DOCUMENTS

| | | |
|---|---|---|
| JP | H0721774 A | 1/1995 |
| JP | 2003257182 A | 9/2003 |
| JP | 2005213371 A1 | 9/2005 |

* cited by examiner

PRECHARGE CIRCUITRY FOR MEMORY

CROSS-REFERENCE TO RELATED APPLICATIONS

This application is the U.S. National Stage of PCT/EP2021/062646, filed May 12, 2021, which claims priority to European Patent Application No. 20174140.2, filed May 12, 2020, the content of both are incorporated herein by reference in their entirety.

FIELD OF THE INVENTION

The present disclosure relates to power-efficient precharge circuitry for bit lines of an array of memory cells. The disclosure further relates to a memory, such as a static random access memory, comprising at least one precharge circuit.

BACKGROUND OF INVENTION

Static random access memories are widely used in integrated circuits and may account for a significant portion of the power consumption of the circuit. A typical memory cell of an SRAM memory is a six-transistor (6T) memory cell made up of six MOSFETs. Each bit is stored on four transistors that form two cross-coupled inverters. In addition to the four transistors, the two cross-coupled inverters are connected to a bit line and an inverted bit line through two further access transistors, which are controlled by a common word line in the standard single-port 6T SRAM cell. Other types of SRAM cells exist.

In the example of a standard 6T memory cell, access to the cell is enabled by the word line, which controls the access transistors, which control whether the cell is connected to the bit lines, which are used for transferring data for read and right operations. Before an access of the memory cell, a precharge circuit is used to initialize the bit lines, i.e., in a standard operation, load the supply voltage into the bit lines. The bit lines have large capacitance due to their length and the diffusion capacitance of the access transistors. A consequence of this structure and process is that a major part of the memory access energy may be consumed by the bit line precharge. Typically, the only way to reduce it is by voltage scaling, which however brings other problems, including speed and stability issues. There is thus a need for a more power-efficient solution, in particular for an improved precharge circuitry and for a memory comprising such an improved precharge circuitry.

In content-addressable memories (CAM) and ternary content-addressable memories (TCAM), instead of reading data, the searched data is fed into the memory as input and the set of outputs lines, typically called matchlines, are outputting information if the match of the input data was found or not. In these memories the whole memory is accessed, and, as a consequence, the switching energy on the matchlines can be very high.

U.S. Pat. No. 5,771,190 A discloses a static type random access memory cell capable of storing a data bit supplied from a bit line pair through two p-channel enhancement type access transistors gated by a word line in a two-stable latch circuit powered with a positive high power voltage and a positive low power voltage, wherein the positive low power voltage is higher than an active level on the word line so that the two-stable latch circuit certainly changes the state depending upon the logic level of a write-in data bit.

US 2017/243633 A1 discloses a memory cell arrangement of SRAM cell groups in which in each of the groups multiple SRAM cells are connected to an input of a local read amplifier by at least one common local bit-line. Outputs of the amplifiers are connected to a shared global bit-line. The global bit-line is connected to a pre-charge circuit, and the pre-charge circuit is adapted for pre-charging the global bit-line with a programmable pre-charge voltage before reading data. The pre-charge circuit comprises a limiter circuit which comprises a pre-charge regulator circuit connected to the global bit-line to pre-charge the global bit-line with the programmable pre-charge voltage, and an evaluation and translation circuit connected to the pre-charge regulator circuit and the global bit-line to compensate leakage current of the global bit-line without changing its voltage level.

US 2007/247885 A1 discloses an entry including multiple bits of unit cells each storing data bit is coupled to a match line. The match line is supplied with a charging current having a restricted current value smaller than a match line current flowing in a one-bit miss state in one entry, but larger than a match line current flowing in an all-bit match state in one entry. A precharge voltage level of a match line is restricted to a voltage level of half a power supply voltage or smaller.

EP 2 211 352 A2 discloses a semiconductor memory device including a first memory circuits connecting to a first bit line, a second bit line and a word line, a first pre-charge control circuit connecting to a first pre-charge control line, the first bit line and the second bit line and that pre-charges the first bit line and the second bit line on the basis of the input from the first pre-charge control line, and a read control circuit having a first transistor, a second transistor, a third transistor and a fourth transistor, wherein the fourth transistor is brought into conduction on the basis of the input from a charged global-bit-line driver control line, the column having the first bit line and the second bit line is thus selected, and the information held in the memory circuit connecting to the driven word line among the memory circuits is output to the third bit line.

SUMMARY OF INVENTION

A first aspect of the present disclosure therefore relates to the reduction of dynamic power in a static random access memory or a content-addressable memory or a ternary content-addressable memory, and in particular to a precharge circuitry for a memory. According to a first embodiment, a precharge circuitry for bit lines of an array of memory cells comprises:
  a precharge and limiting unit configured to precharge a first bit line and a second bit line; the precharge and limiting unit further configured to limit a first bit line precharge level of the first bit line and a second bit line precharge level of the second bit line during a precharge cycle of a read and/or write operation of any of the memory cells,
  wherein the precharge and limiting unit is configured to limit the first bit line precharge level and the second bit line precharge level in a single precharge cycle, preferably without substantial delay.

The presently disclosed precharge circuitry offers a compact and fast solution for limiting the precharge levels of the bit lines for read and write operations. The solution limits the precharge levels from floating levels in a single precharge cycle, without substantial delay, and works without impacting the stability of the cell or the memory performance.

The memory cells and precharge circuits of a memory typically operate at a common supply voltage (VDD). The precharge circuit, including the precharge and limiting unit may thus operate at a general supply voltage that is equal to the voltage level of the memory cells. However, as demonstrated in the present disclosure, it is possible to connect the transistors of the precharge circuitry and select dimensions and types of some of the transistors such that the voltage level of the bit lines during precharge is not the supply voltage but a lower level. As an example, the the first bit line precharge level and second bit line precharge level may be 10-80% or 20-80% lower than the supply voltage (VDD). This implementation may imply significant power savings. The technique can be used for a range of supply voltages with sufficient margins not to adversely impact the memory cell stability. The inventor has realized that the precharge circuitry can be configured to set the first bit line precharge level from a first floating level and the second bit line precharge level from a second floating level directly upon an initiation of the precharge cycle. As demonstrated in the present disclosure there are several possible embodiments, including PMOS based, NMOS based or a combination.

The present disclosure further relates to a memory, such as a static random access memory, a content-addressable memory or a ternary content-addressable memory, comprising:

a plurality of memory cells arranged in columns and rows, each memory cell comprising an arrangement of memory cell transistors defining a first storage node and an inverted first storage node accessed from a first bit line and a second bit line;

at least one precharge circuit, wherein the precharge circuit is connected to the first bit line and the second bit line within a column, wherein each precharge circuit is configured to limit the first bit line to a first bit line precharge level and the second bit line to a second bit line precharge level during a precharge cycle.

By limiting the precharge level of the bit lines, preferably to a level lower than the general supply voltage (VDD), as illustrated in FIG. 2, the dynamic power consumption of the memory can be significantly improved. The value of the limited precharge level may be adjusted such that the stability of the bitcell in read and write is not impacted, which is feasible in the design phase. The solution is fast and applied within a single precharge operation and can be configured to work without impacting the stability of the cell or the memory performance.

In one embodiment of the memory, the memory has both local and global precharge circuits. Specifically, the global precharge circuit(s) may be configured to precharge the bit lines to reduced/limited precharge level, such as a precharge level 10-80% or 20-80% lower than a supply voltage level, whereas the local precharge circuit(s) may precharge at full supply voltage level.

DETAILED DESCRIPTION OF THE INVENTION

Figure 1:
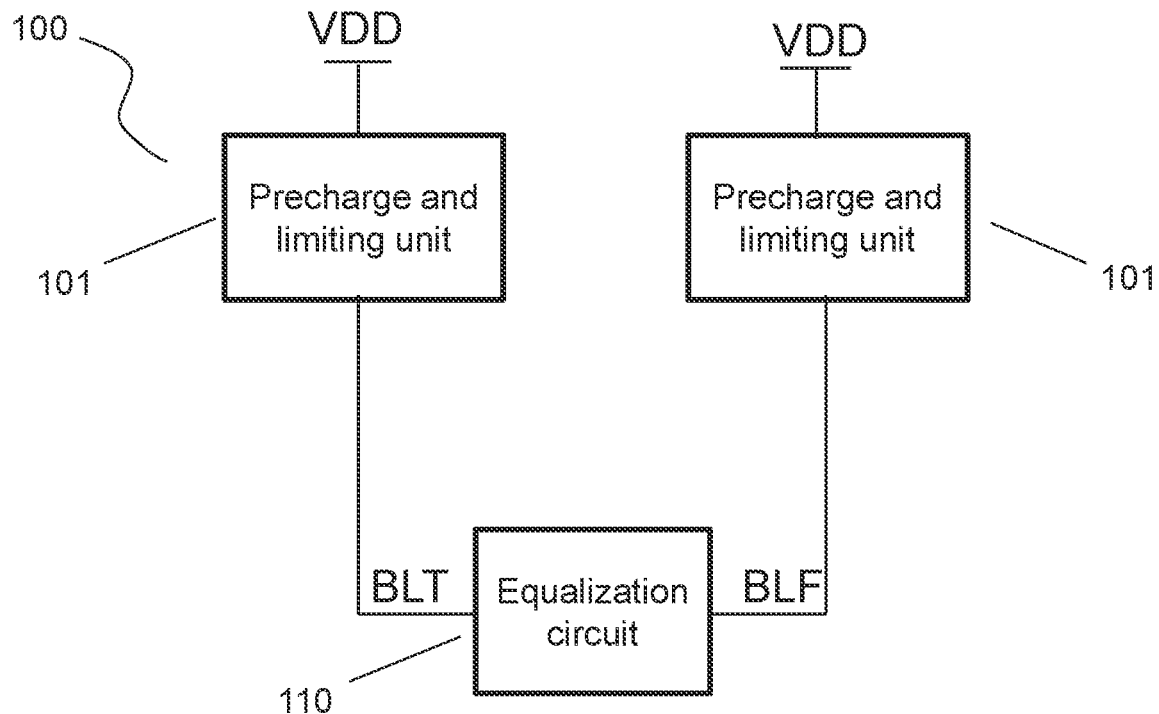
FIG. 1 shows an exemplary embodiment of the presently disclosed precharge circuitry for bit lines of an array of memory cells.

The present disclosure relates to a precharge circuitry for bit lines of an array of memory cells. The precharge circuitry comprises a precharge unit configured to precharge a first bit line and a second bit line and a limiting unit configured to limit a first bit line precharge level of the first bit line and a second bit line precharge level of the second bit line during a precharge cycle of a read and/or write operation of any of the memory cells by controlling an operation of the precharge unit. The limiting unit may be seen as an integral part of the precharge unit. Preferably, the precharge circuitry is adapted to limit the first bit line precharge level and the second bit line precharge level without delay during the precharge cycle. The first bit line may be a positive or 'true' bit line and the second bit line may be a negative or 'false' bit line, which is the inverted value of the positive or 'true' bit line, of a column of the array of memory cells. A memory may, under certain circumstances, be implemented having only one bit line instead of two. For such a memory, the precharge circuitry may is configured to precharge a first bit line and limit the first bit line to a first bit line precharge level during a precharge cycle. In one embodiment, the precharge circuitry comprises:

a precharge and limiting unit configured to precharge a first bit line, the precharge and limiting unit further configured to limit a first bit line precharge level of the first bit line during a precharge cycle of a read and/or write operation of any of the memory cells, wherein the precharge and limiting unit is configured to limit the first bit line precharge level in a single precharge cycle, preferably without substantial delay.

The precharge and limiting unit may, by extension, be configured and applied to any bitcell having a configuration with more than two bit lines, wherein different bit lines are used depending on the operation. This may include, for example, a two-port 8T bitcell having one read and two read/write bit lines, and a dual-port 8T bitcell having two pairs of read/write bit lines.

The limitation of the precharge level may be seen as a limitation in relation to the conventional precharge level, which is the general supply voltage level (VDD). The precharge and limiting unit may thus operate at a general voltage level (VDD) equal to a voltage level of the memory cells. The concept is exemplified in FIG. 2. Instead of precharging to VDD, as would be the normal approach, the bit lines are precharged to the lower VPRE level. Preferably, the precharge circuitry is arranged such that precharge occurs substantially immediately, when the precharge cycle begins. After an access of the memory cells of a memory, the bit lines may have floating voltage levels. The precharge circuitry of a memory is therefore to prepare the bit lines for a new access. Accordingly, in one embodiment of the presently disclosed precharge circuitry, the precharge circuitry is configured to set the first bit line precharge level from a first floating level and the second bit line precharge level from a second floating level directly upon an initiation of the precharge cycle.

According to one embodiment of the presently disclosed precharge circuitry, the first bit line precharge level and second bit line precharge level are 10-80% lower than the supply voltage (VDD), preferably 20-70% lower than the supply voltage (VDD), or 10-50% lower than the supply voltage (VDD), preferably wherein the first bit line precharge level and second bit line precharge level are 20-40% lower than the supply voltage (VDD). The precharge circuitry may thereby offer a dynamically reduced precharge voltage on the bit lines by precharging through the precharge circuit with diode connected transistors. This results in the reduced precharge voltage both during read and write resulting in lower access energy due to the square root dependency of the dynamic energy of the voltage. The gain may be significant both on the accessed word, in particular for write, but also for the remaining cells on the accessed word line which in both read and write case are in read mode. As demonstrated in the present disclosure, the implementation can be made in different ways, by connecting the transistors in certain ways and by dimensioning or selecting type of transistors or, if available, by changing the body bias voltage of the precharge transistors.

Figure 3:
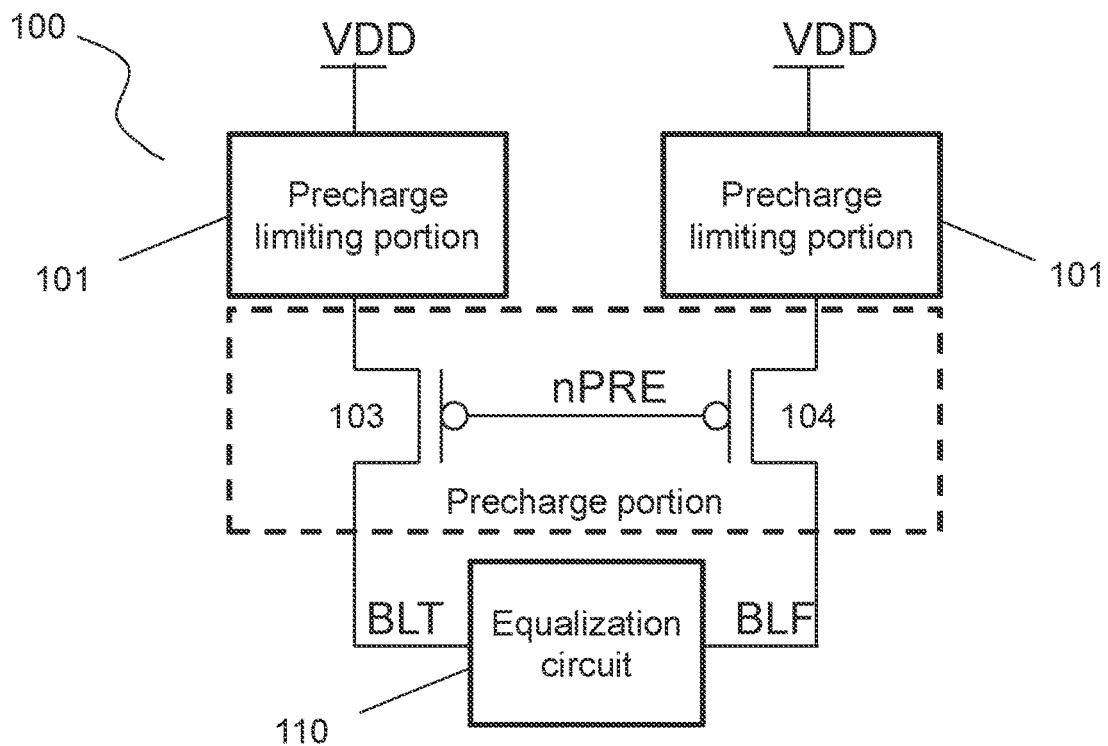
FIGS. 3-4 show further embodiments of the presently disclosed precharge circuitry.
Figure 4:
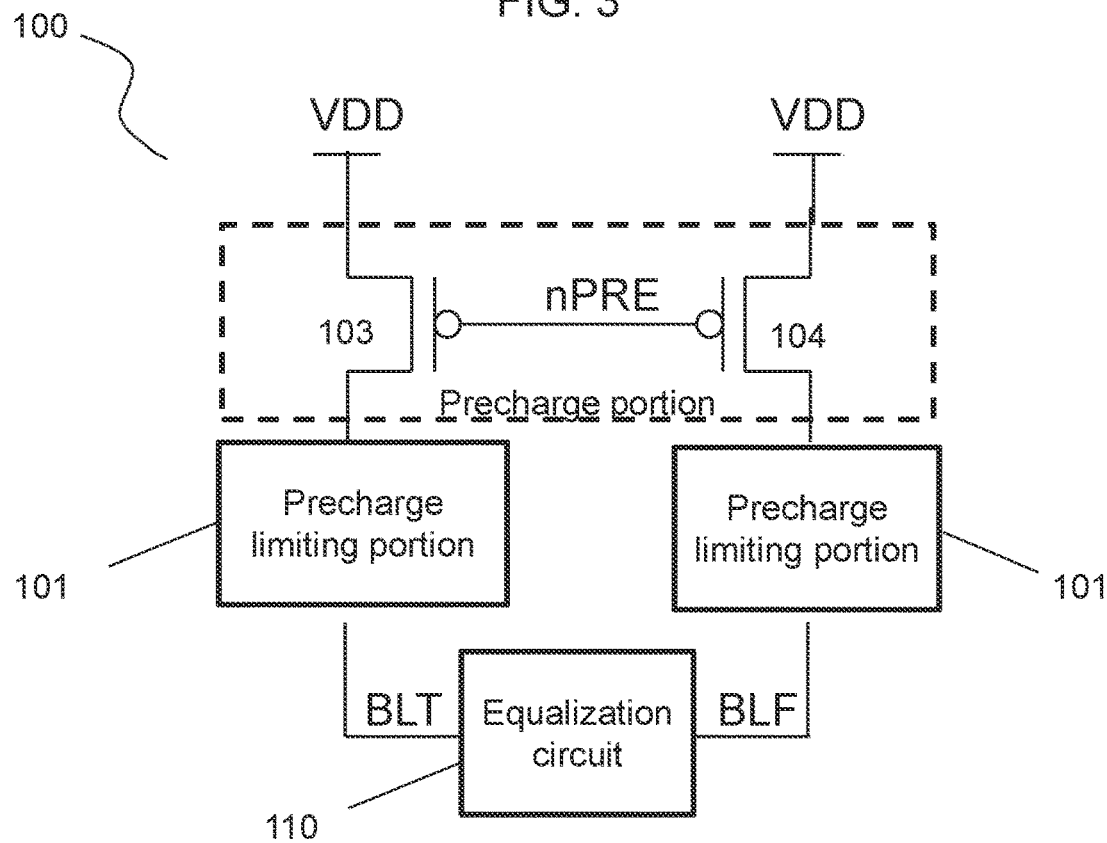

As stated, the presently disclosed precharge and limiting unit may be implemented in a number of implementations. FIGS. 1, 3 and 4 are high level diagrams showing how a precharge circuit can be supplemented by a precharge limiting circuit, optionally with an equalizing circuit. FIGS. 5A-E show examples of transistor level implementations. In the case where the precharge circuits are based on PMOS transistor solutions, the person skilled in art will acknowledge that the implementations can also be achieved in corresponding NMOS solutions. This includes using NMOS transistors and connecting the precharge circuit to GND instead of VDD. Accordingly, limiting the precharge levels may, within the context of the present disclosure, be construed as limiting with respect to a GND level, i.e. not precharging to GND but to precharge level higher than ground, such as 10-80% higher than GND or 20-80% higher than GND or 20-70% higher than GND, or such as 10-50% higher than GND, preferably 20-40% higher than GND.

One embodiment of the presently disclosed precharge and limiting unit comprises a PMOS transistor based or NMOS transistor based precharge portion configured to precharge the first bit line and the second bit line; and a PMOS transistor based or NMOS transistor based limiting portion configured to limit the first bit line precharge level and the second bit line precharge level relative to a supply voltage (VDD) or ground reference level (GND) without substantial delay by short-circuiting the first bit line to a first limited precharge level node of the PMOS transistor based or NMOS transistor based limiting portion, and by short-circuiting the second bit line to a second limited precharge level node of the PMOS transistor based or NMOS transistor based limiting portion.

More specifically, the precharge circuitry may comprise:
a first PMOS transistor, a second PMOS transistor and a third PMOS transistors, the first, second and third PMOS transistors being connected in series to provide a precharge portion;
a fourth PMOS transistor and a fifth PMOS transistor connected between the precharge portion and a supply voltage (VDD) to provide a limiting portion,
a. wherein the first bit line is connected to either a fourth gate terminal of the fourth PMOS transistor or to a second gate terminal of the second PMOS transistor, thereby limiting the first bit line precharge level, and
b. wherein the second bit line is connected to either a fifth gate terminal of the fifth PMOS transistor or to a third gate terminal of the third PMOS transistor, thereby limiting the second bit line precharge level.

The same structure is possible using NMOS transistors. In this embodiment, the precharge circuitry comprises:
a first NMOS transistor, a second NMOS transistor and a third NMOS transistors, the first, second and third NMOS transistors being connected in series to provide a precharge portion;
a fourth NMOS transistor and a fifth NMOS transistor connected between the precharge portion and a ground reference point (GND) to provide a limiting portion relative to the ground reference point,
a. wherein the first bit line is connected to either a fourth gate terminal of the fourth NMOS transistor or to a second gate terminal of the second NMOS transistor, thereby limiting the first bit line precharge level relative to the ground reference point, and
b. wherein the second bit line is connected to either a fifth gate terminal of the fifth NMOS transistor or to a third gate terminal of the third NMOS transistor, thereby limiting the second bit line precharge level relative to the ground reference point.

According to one embodiment the precharge circuitry comprises:
a first PMOS transistor having a first gate terminal, a first drain terminal, and a first source terminal;
a second PMOS transistor having a second gate terminal, a second drain terminal, and a second source terminal;
and a third PMOS transistor having a third gate terminal, a third drain terminal, and a third source terminal,
wherein a connection between the first and second PMOS transistors defines a first bit line node connected to the first bit line,
wherein a connection between the first and third PMOS transistors defines a second bit line node connected to the second bit line, and
wherein a precharge signal is connected to the first gate terminal, to the second gate terminal, and to a third gate terminal.

A limiting portion may comprise:
a fourth PMOS transistor having a fourth gate terminal, a fourth drain terminal, and a fourth source terminal, the fourth PMOS connected between the second PMOS transistor and a supply voltage (VDD);
a fifth PMOS transistor having a fifth gate terminal, a fifth drain terminal, and a fifth source terminal; the fifth PMOS connected between the third PMOS transistor and the supply voltage (VDD),
wherein the fourth gate terminal is connected to the first bit line node and the fifth gate terminal is connected to the second bit line node.

According to one embodiment, the second PMOS transistor and the third PMOS transistors are connected to a ground reference point (GND). In this embodiment, three PMOS transistors may be enough to implement a precharge-to-ground precharge and limiting unit.

The fourth PMOS transistor and fifth PMOS transistor may be dimensioned such the first bit line precharge level and the second bit line precharge level are limited compared to the supply voltage (VDD) and/or wherein a transistor type of the fourth PMOS transistor and fifth PMOS transistor are selected such the first bit line precharge level and the second bit line precharge level are limited compared to the supply voltage (VDD). As can be seen, the combination of connecting the gate signals of the fourth and fifth transistors to the bit lines and selecting the fourth and fifth transistors with characteristics that limit the precharge values of the bit lines can be done in a way that provides the wanted precharge level without substantial delay. Similarly, for an NMOS implementation, the fourth NMOS transistor and fifth NMOS transistor may be dimensioned such the first bit line precharge level and the second bit line precharge level are higher than the ground reference point (GND) and/or wherein the fourth NMOS transistor and fifth NMOS transistor are selected such the first bit line precharge level and the second bit line precharge level are higher than the ground reference point (GND).

The PMOS transistors in this embodiment may be NMOS transistors and the supply voltage VDD may be GND.

According to a further embodiment, a precharge portion comprises:
  a first PMOS transistor having a first gate terminal, a first drain terminal, and a first source terminal;
  a second PMOS transistor having a second gate terminal, a second drain terminal, and a second source terminal;
  and a third PMOS transistor having a third gate terminal, a third drain terminal, and a third source terminal,
  a fourth PMOS transistor having a fourth gate terminal, a fourth drain terminal, and a fourth source terminal, the fourth PMOS connected between the second PMOS transistor and a supply voltage (VDD);
  a fifth PMOS transistor having a fifth gate terminal, a fifth drain terminal, and a fifth source terminal; the fifth PMOS connected between the third PMOS transistor and the supply voltage (VDD),
  wherein a connection between the first and second PMOS transistors defines a first bit line node connected to the first bit line,
  wherein a connection between the first and third PMOS transistors defines a second bit line node connected to the second bit line, and
  wherein a precharge signal is connected to the first gate terminal, to the fourth gate terminal, and to the fifth gate terminal.

In this embodiment, the second gate terminal may be connected to the first bit line node and the third gate terminal is connected to the second bit line node.

The fourth PMOS transistor and fifth PMOS transistor may be dimensioned such the first bit line precharge level and the second bit line precharge level are limited compared to the supply voltage (VDD) and/or wherein a transistor type of the fourth PMOS transistor and fifth PMOS transistor are selected such the first bit line precharge level and the second bit line precharge level are limited compared to the supply voltage (VDD).

The PMOS transistors in this embodiment may be NMOS transistors and the supply voltage VDD may be GND.

In a further embodiment, the precharge circuitry comprises:

a first NMOS transistor having a first gate terminal, a first drain terminal, and a first source terminal;
a second NMOS transistor having a second gate terminal, a second drain terminal, and a second source terminal;
and a third NMOS transistor having a third gate terminal, a third drain terminal, and a third source terminal,
wherein a connection between the first and second NMOS transistors defines a first bit line node connected to the first bit line,
wherein a connection between the first and third NMOS transistors defines a second bit line node connected to the second bit line, and
wherein a precharge signal is connected to the first gate terminal, to the second gate terminal, and to a third gate terminal.

The limiting portion may further comprise:
a fourth NMOS transistor having a fourth gate terminal, a fourth drain terminal, and a fourth source terminal, the fourth NMOS connected between the second NMOS transistor and a ground reference point (GND); and
a fifth NMOS transistor having a fifth gate terminal, a fifth drain terminal, and a fifth source terminal; the fifth NMOS connected between the third NMOS transistor and the ground reference point (GND),
wherein the fourth gate terminal is connected to the first bit line node and the fifth gate terminal is connected to the second bit line node.

In a further embodiment, the precharge circuitry comprises:
a first NMOS transistor having a first gate terminal, a first drain terminal, and a first source terminal;
a second NMOS transistor having a second gate terminal, a second drain terminal, and a second source terminal;
and a third NMOS transistor having a third gate terminal, a third drain terminal, and a third source terminal,
a fourth NMOS transistor having a fourth gate terminal, a fourth drain terminal, and a fourth source terminal, the fourth NMOS connected between the second NMOS transistor and a ground reference point (GND);
a fifth NMOS transistor having a fifth gate terminal, a fifth drain terminal, and a fifth source terminal; the fifth NMOS connected between the third NMOS transistor and the ground reference point (GND),
wherein a connection between the first and second NMOS transistors defines a first bit line node connected to the first bit line,
wherein a connection between the first and third NMOS transistors defines a second bit line node connected to the second bit line, and
wherein a precharge signal is connected to the first gate terminal, to the fourth gate terminal, and to the fifth gate terminal.

The second gate terminal may be connected to the first bit line node and the third gate terminal may connected to the second bit line node. The fourth NMOS transistor and fifth NMOS transistor may be dimensioned such the first bit line precharge level and the second bit line precharge level are higher than the ground reference point (GND) and/or selected such the first bit line precharge level and the second bit line precharge level are higher than the ground reference point (GND).

From the examples of the present disclosure it can be understood that within the scope of the presently disclosed precharge circuitry, it is possible to limit the bit lines by means of a VDD limiter based on PMOS, NMOS or a combination, and by means of a corresponding GND limiter based on PMOS, NMOS or a combination.

The precharge circuitry may further include an equalization circuit connected between the first bit line and the second bit line. The equalization circuit may be an integral part of the precharge circuitry. Examples of equalization circuit are found in FIGS. 7A-C.

In one embodiment, the equalization circuit comprises an equalizer NMOS transistor or an equalizer PMOS transistor connected between the first bit line and the second bit line, wherein the precharge signal is connected to the gate terminal of the equalizer NMOS transistor or equalizer PMOS transistor. In an alternative embodiment, the equalization circuit comprises an equalizer NMOS transistor and an equalizer PMOS transistor connected in parallel, wherein the equalizer NMOS transistor and equalizer PMOS transistor are connected between the first bit line and the second bit line.

The present disclosure further relates to a memory, such as a static random access memory, comprising:
- a plurality of memory cells arranged in columns and rows, each memory cell comprising an arrangement of memory cell transistors defining a first storage node and an inverted first storage node accessed from a first bit line and a second bit line;
- at least one precharge circuit, wherein the precharge circuit is connected to the first bit line and the second bit line within a column, wherein each precharge circuit is configured to limit the first bit line to a first bit line precharge level and the second bit line to a second bit line precharge level during a precharge cycle.

The precharge circuit may be any embodiment of the presently disclosed precharge circuit. The memory cells may be cells of, for example, a 4T, 5T, 6T, 7T, 8T or any suitable memory cell. The memory may be a static random access memory or a content-addressable memory or a ternary content-addressable memory.

If the memory is a content-addressable memory or a ternary content-addressable memory, the presently disclosed precharge circuitry may be used to limit the matchlines of the memory. Therefore, the present disclosure further relates to a precharge circuitry for matchlines of an array of memory cells, the precharge circuitry comprising:
- a precharge and limiting unit configured to precharge a matchline, the precharge and limiting unit further configured to limit a matchline precharge level of the matchline during a precharge cycle of a read and/or write operation of any of the memory cells,
- wherein the precharge and limiting unit is configured to limit the matchline precharge level a single precharge cycle, preferably without substantial delay.

As an example, the arrangement of memory cell transistors may comprise:
a. a first memory cell transistor, a second memory cell transistor, a third memory cell transistor and a fourth memory cell transistor forming first and second cross-coupled inverters defining the first storage node and the inverted first storage node;
b. a fifth memory cell transistor connected between the first storage node and the first bit line; and/or a sixth transistor connected between the inverted first storage node and the second bit line.

The precharge circuit may comprise:
a precharge and limiting unit configured to precharge the first bit line and the second bit line; the precharge and limiting unit further configured to limit a first bit line precharge level of the first bit line and a second bit line precharge level of the second bit line during a precharge cycle of a read and/or write operation of any of the memory cells,
wherein the precharge and limiting unit is configured to limit the first bit line precharge level and the second bit line precharge level in a single precharge cycle, preferably without substantial delay.

The memory may further comprise any additional peripheral part for making the memory functional, such as, but not limited to:
a row decoder;
a column decoder;
sense amplifiers.

The presently disclosed precharge circuitry may be exploited in different ways in a memory structure. In a partitioning of a memory, both local precharge circuits and global precharge circuits can be used or a single precharge circuit connected to the global bit lines. Therefore, in one embodiment, memory cells arranged in each column are connected to a first local bit line and a second local bit line, wherein at least one local precharge circuit is connected to each local bit line, and wherein a global first bit line can be configured to be connected to any first local bit line and a global second bit line can be configured to be connected to any second local bit line, wherein a global precharge circuit is connected to the global first bit line and global second bit line.

Figure 11:
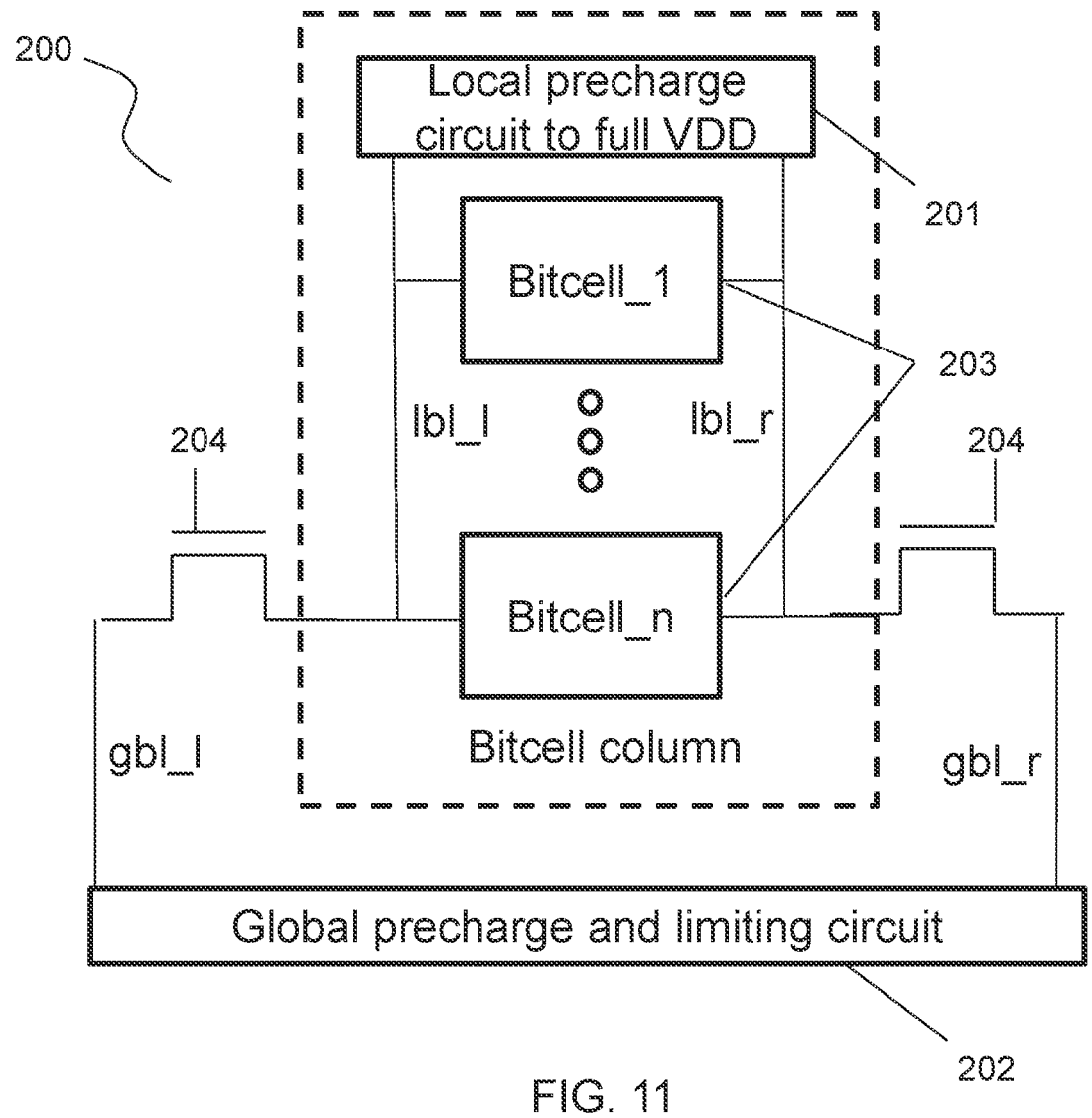
FIG. 11 shows a further embodiment of the presently disclosed memory, wherein the local and global precharge circuits operate at different precharge levels.

The local bit lines and global bit lines are separated by switch elements which may be configured to allow the voltage transfer from local to global bit lines during read and from global to local bit lines during write. According to one embodiment, the local bit lines and the global bit lines are separated by switch elements, such as NMOS transistors. An example of this configuration is shown in FIG. 11. In this implementation the local bit lines may be precharged to full VDD, whereas the global bit lines are precharged to limited voltage. In one embodiment, during a write operation, one of the global bit lines is pulled to '0' and the switch element is opened by activating a 'sel' signal. The NMOS switch element limits the propagation of the limited precharge voltage into the local bit line, limiting the impact of this scheme on bitcell stability.

In one embodiment, during a read operation the 'sel' signal is activated on both sides simultaneously. In this embodiment, on one side the global bit line remains constant or increases by a voltage via charge sharing principle with the local bit line, depending on what kind of switch element is used. On the other side the global bit line is pulled down through the local bit line as soon as the local bit line drops below the limited precharge voltage of the global bit lines. An alternative embodiment comprises discharging the local bit line below the global bit line precharge voltage and then activate the 'sel' signal.

More specifically, the local precharge circuit may be a precharge circuit without the presently disclosed limitation, and the global precharge circuit may include the presently disclosed limiting unit. In one embodiment, the global precharge circuit is configured to precharge the bit lines to a precharge level 10-80% lower than a supply voltage level (VDD) or 10-50% lower than a supply voltage level (VDD), and the local precharge circuit is configured to precharge the bit lines to the supply voltage level. Also, in this case the precharge circuits can be PMOS-, NMOS-based variants or a combination.

DETAILED DESCRIPTION OF DRAWINGS

The invention will in the following be described in greater detail with reference to the accompanying drawings. The drawings are exemplary and are intended to illustrate some of the features of the presently disclosed precharge circuitry and memory, and are not to be construed as limiting to the presently disclosed invention.

FIG. 1 shows an exemplary embodiment of the presently disclosed precharge circuitry (100) for bit lines (BLT, BLF) of an array of memory cells. The precharge circuitry (100) comprises two precharge limiting circuits (101) and an equalization circuit (110). A connection between one of the precharge and limiting circuits (101) and the equalization circuit (110) defines a first bit line node (BLT). A connection between the other one of the precharge and limiting circuits (101) and the equalization circuit (110) defines a second bit line node (BLF).

Figure 2:
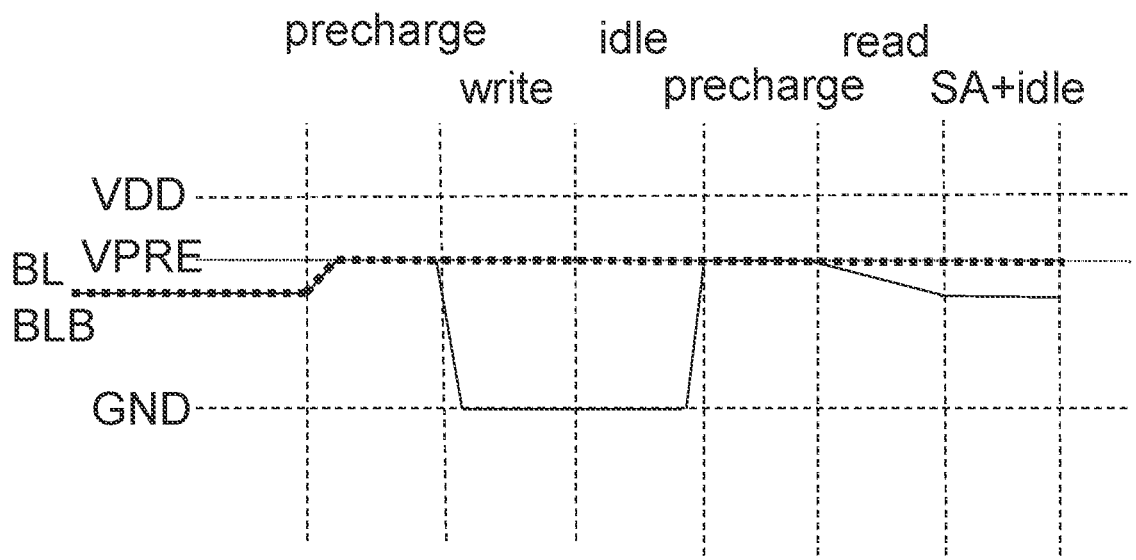
FIG. 2 shows examples of signal levels for memory access using the presently disclosed precharge circuitry.

FIG. 2 shows examples of signal levels for memory access using the presently disclosed precharge circuitry. It can be seen that the bit lines are precharged to VPRE during the precharge cycle. During the write cycle one of the bi lines goes to GND while the word line is accessed. In the idle cycle the bit lines are effectively floating. Next, a read access starts by a precharge cycle. During the read cycle the word line is accessed and the cell discharges one of the bit lines slowly. The SA+idle cycle is the end of the read operation where the word line is closed and the sense amplifier is triggered, followed by the idle mode where the bit lines are again floating.

FIG. 3 shows a further embodiment of the presently disclosed precharge circuitry (100). The precharge circuitry (100) comprises two limiting portions (101) configured to limit a first bit line precharge level of the first bit line and a second bit line precharge level of the second bit line during a precharge cycle; two PMOS transistors (103, 104) constituting a precharge portion of the precharge and limiting unit, wherein a precharge signal (nPRE) is connected to the gate terminals; and an equalization circuit (110) arranged between the first bit line (BLT) and the second bit line (BLF). FIG. 4 shows a similar precharge circuitry (100) wherein the two limiting portions (101) are arranged between the bit lines (BLT, BLF) and the two PMOS transistors (103, 104) instead of between the supply voltage (VDD) and the two PMOS transistors (103, 104). Instead of PMOS transistors, NMOS transistors may be used.

Figure 5A:
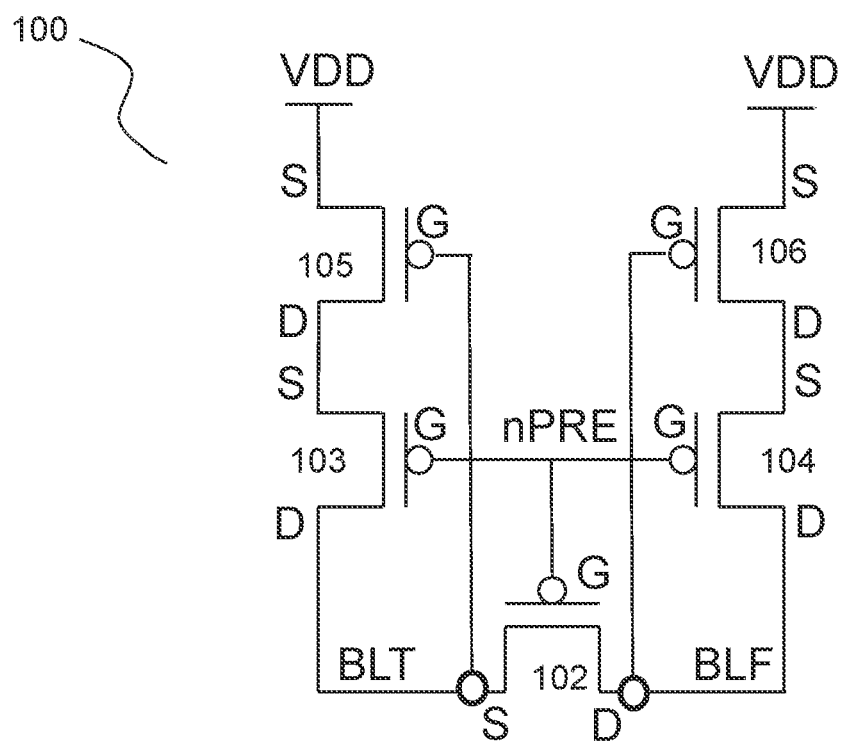
FIGS. 5A-E show transistor level implementations of embodiments of the presently disclosed precharge circuitry.
Figure 5B:
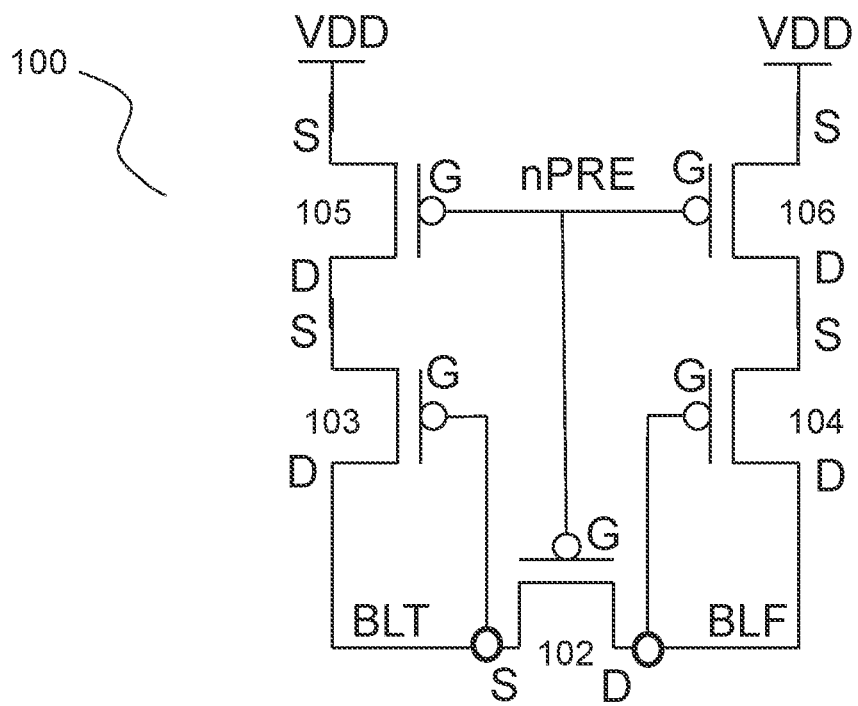
Figure 5C:
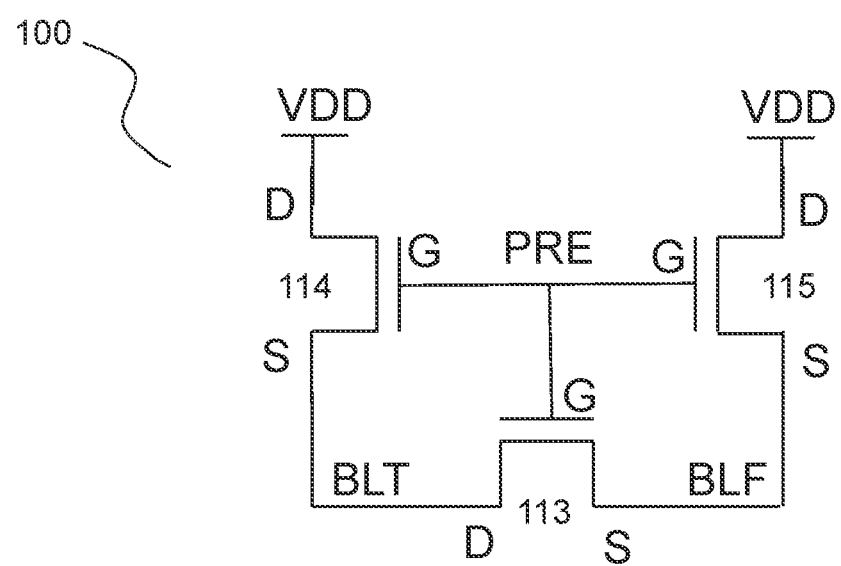
Figure 5D:
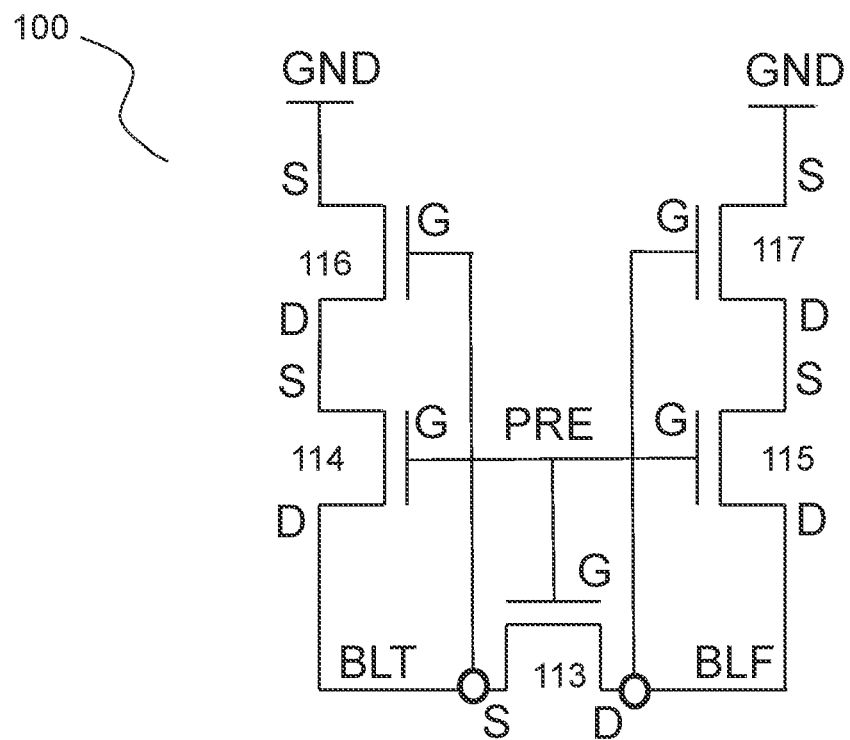
Figure 5E:
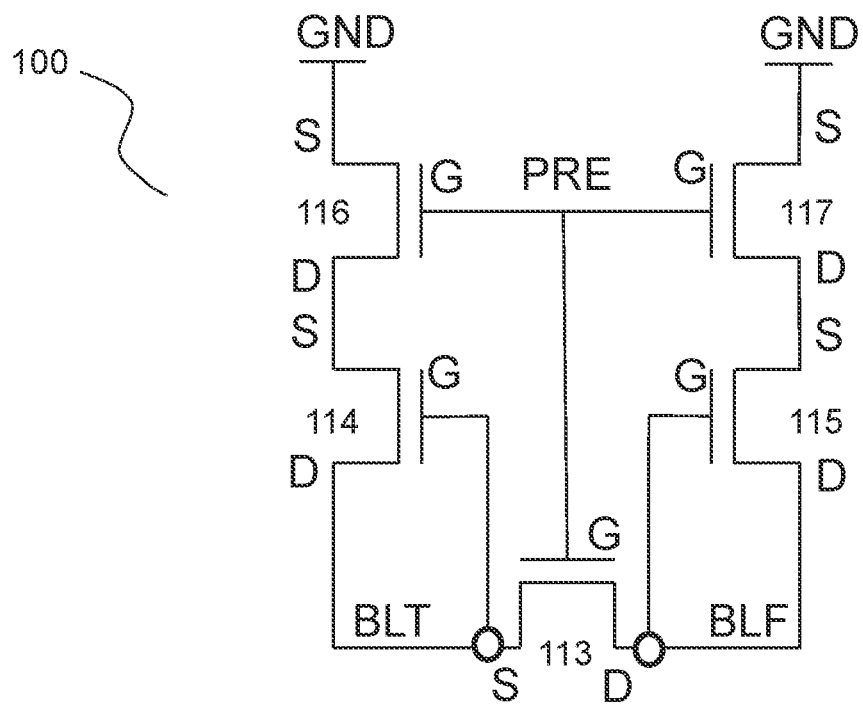

FIGS. 5A-E show transistor level implementations of embodiments of the presently disclosed precharge circuitry (100). In the example of FIG. 5A, the precharge circuitry (100) comprises a first PMOS transistor (102), a second PMOS transistor (103) and a third PMOS transistor (104). A connection between the source terminal of the first PMOS transistor (102) and the drain terminal of the second PMOS transistor (103) defines a first bit line node (BLT). A connection between the drain terminal of the first PMOS transistor (102) and the drain terminal of the third PMOS transistor (104) defines a second bit line node (BLF). A precharge signal (nPRE) is connected to the gate terminal of the first (102), second (103) and third (104) PMOS transistors. A fourth PMOS transistor (105) is connected between the source terminal of the second PMOS transistor (103) and a supply voltage (VDD). A fifth PMOS transistor (106) is connected between the source terminal of the third PMOS transistor (104) and the supply voltage (VDD). The gate terminal of the fourth PMOS transistor (105) is connected to the first bit line node (BLT). The gate terminal of the fifth PMOS transistor (106) is connected to the second bit line node (BLF). The source terminal of the fourth PMOS transistor (105) is connected to the supply voltage (VDD). The drain terminal of the fourth PMOS transistor (105) is connected to the source terminal of the second PMOS transistor (103). The source terminal of the fifth PMOS transistor (106) is connected to the supply voltage (VDD). The drain terminal of the fifth PMOS transistor (106) is connected to the source terminal of the third PMOS transistor (104). In the example of FIG. 5B, which is similar to FIG. 5A, the precharge signal (NPRE) is connected to the gate terminal of the first (102), fourth (105) and fifth (106) PMOS transistors, whereas the gate terminal of the second PMOS transistor (103) is connected to the first bit line node (BLT) and the gate terminal of the third PMOS transistor (104) is connected to the second bit line node (BLF). In the example of FIG. 5C, the precharge circuitry (100) comprises a first NMOS transistor (113), a second NMOS transistor (114) and a third NMOS transistor (115). A connection between the drain terminal of the first NMOS transistor (113) and the source terminal of the second NMOS transistor (114) defines a first bit line node (BLT). A connection between the source terminal of the first NMOS transistor (113) and the source terminal of the third NMOS transistor (115) defines a second bit line node (BLF). A precharge signal (PRE) is connected to the gate terminal of the first (113), second (114) and third (115) NMOS transistors. The drain terminal of the second NMOS transistor is connected to the supply voltage (VDD). The drain terminal of the third NMOS transistor is connected to the supply voltage (VDD). In the example of FIG. 5D, the precharge circuitry (100) comprises a first NMOS transistor (113), a second NMOS transistor (114), a third NMOS transistor (115), a fourth NMOS transistor (116) and a fifth NMOS transistor (117). A connection between the source terminal of the first NMOS transistor (113) and the drain terminal of the second NMOS transistor (114) defines a first bit line node (BLT). A connection between the drain terminal of the first NMOS transistor (113) and the drain terminal of the third NMOS transistor (115) defines a second bit line node (BLF). The source terminal of the fourth NMOS transistor (116) is connected to ground (GND). The drain terminal of the fourth NMOS transistor (116) is connected to the source terminal of the second NMOS transistor (114). The source terminal of the fifth NMOS transistor (117) is connected to ground (GND). The drain terminal of the fifth NMOS transistor (117) is connected to the source terminal of the third NMOS transistor (115). A precharge signal (PRE) is connected to the gate terminal of the first (113), second (114) and third (115) NMOS transistors. The gate terminal of the fourth NMOS transistor (116) is connected to the first bit line node (BLT). The gate terminal of the fifth NMOS transistor (117) is connected to the second bit line node (BLF). In the example of FIG. 5E, the precharge circuitry (100) comprises a first NMOS transistor (113), a second NMOS transistor (114), a third NMOS transistor (115), a fourth NMOS transistor (116) and a fifth NMOS transistor (117). A connection between the source terminal of the first NMOS transistor (113) and the drain terminal of the second NMOS transistor (114) defines a first bit line node (BLT). A connection between the drain terminal of the first NMOS transistor (113) and the drain terminal of the third NMOS transistor (115) defines a second bit line node (BLF). The source terminal of the fourth NMOS transistor (116) is connected to ground (GND). The drain terminal of the fourth NMOS transistor (116) is connected to the source terminal of the second NMOS transistor (114). The source terminal of the fifth NMOS transistor (117) is connected to ground (GND). The drain terminal of the fifth NMOS transistor (117) is connected to the source terminal of the third NMOS transistor (115). A precharge signal (PRE) is connected to the gate terminal of the first (113), fourth (116) and fifth (117) NMOS transistors. The gate terminal of the second NMOS transistor (114) is connected to the first bit line node (BLT). The gate terminal of the third NMOS transistor (115) is connected to the second bit line node (BLF).

Figure 6A:
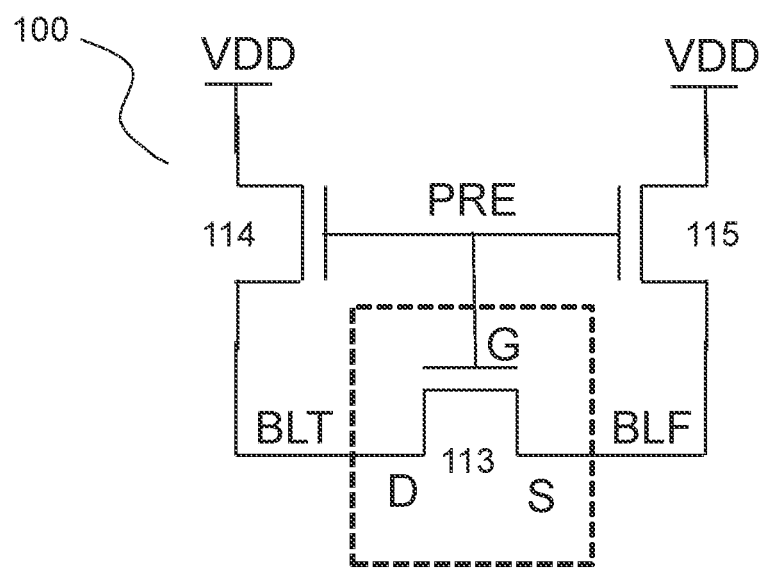
FIGS. 6A-B show embodiments of further improvements of speed and reliability of the limited precharge circuit.
Figure 6B:
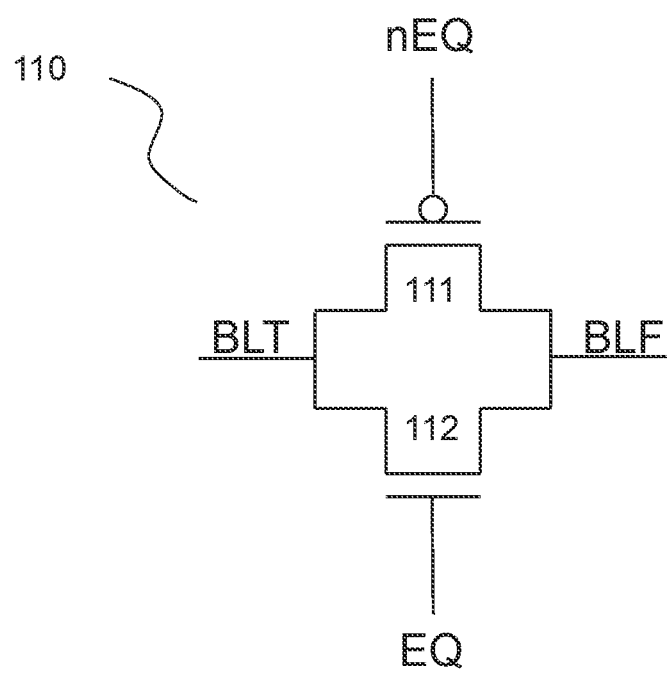

FIG. 6A shows an NMOS based precharge and limiting circuitry comprising a first NMOS transistor (113), a second NMOS transistor (114) and a third NMOS transistor (115). For this implementation, an equalization circuit (110) of FIG. 6B may be used, either as replacement of 113 in FIG. 6A or as an additional parallel circuit, to further improve the speed and reliability of the limited precharge circuit. When EQ is low and nEQ high, BLT and BLF are effectively short-circuited. In one embodiment, the precharge and limiting unit is configured to set EQ low and nEQ high when a memory access is started, i.e. at least some time before the precharge occurs, and keep EQ low and nEQ high for at least some time after memory access has been completed. The rest of the time EQ is kept high and nEQ low.

Figure 7A:
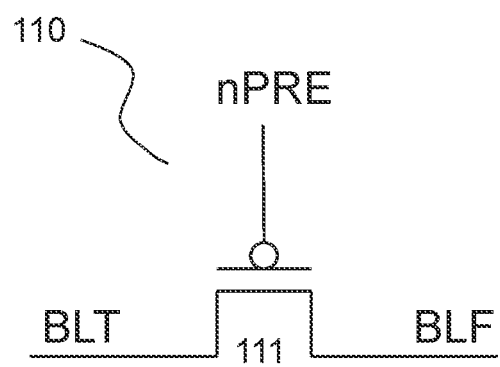
FIGS. 7A-C show embodiments of equalization circuits for the presently disclosed precharge circuitry.
Figure 7B:
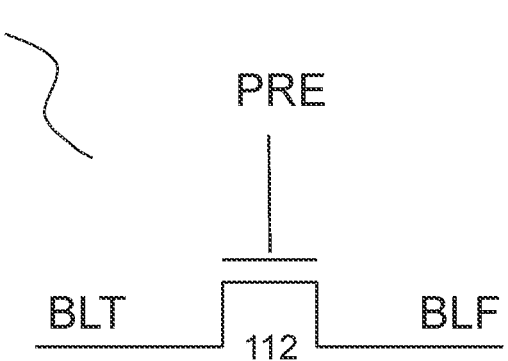
Figure 7C:
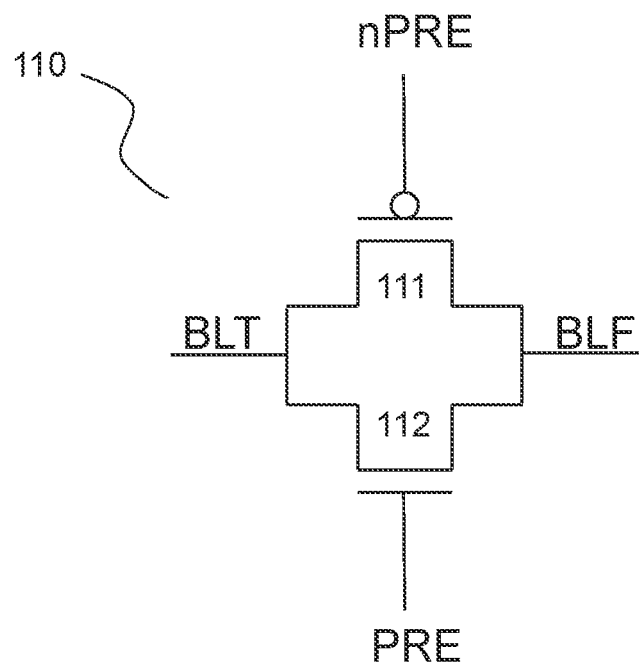

FIGS. 7A-C show embodiments of equalization circuits for the presently disclosed precharge circuitry. Preferably, the equalization circuit (110) is an integral part of the precharge circuitry and arranged between the first bit line and the second bit line as shown in, for example, FIG. 3. and FIG. 4. FIG. 7A shows an example wherein the equalization circuit (110) is implemented as an equalizer PMOS transistor (111). FIG. 7B shows an example wherein the equalization circuit (110) is implemented as an equalizer NMOS transistor (112). FIG. 7C shows an example wherein the equalization circuit (110) is implemented as an equalizer NMOS transistor (112) and an equalizer PMOS transistor (111) connected in parallel.

Figure 8:
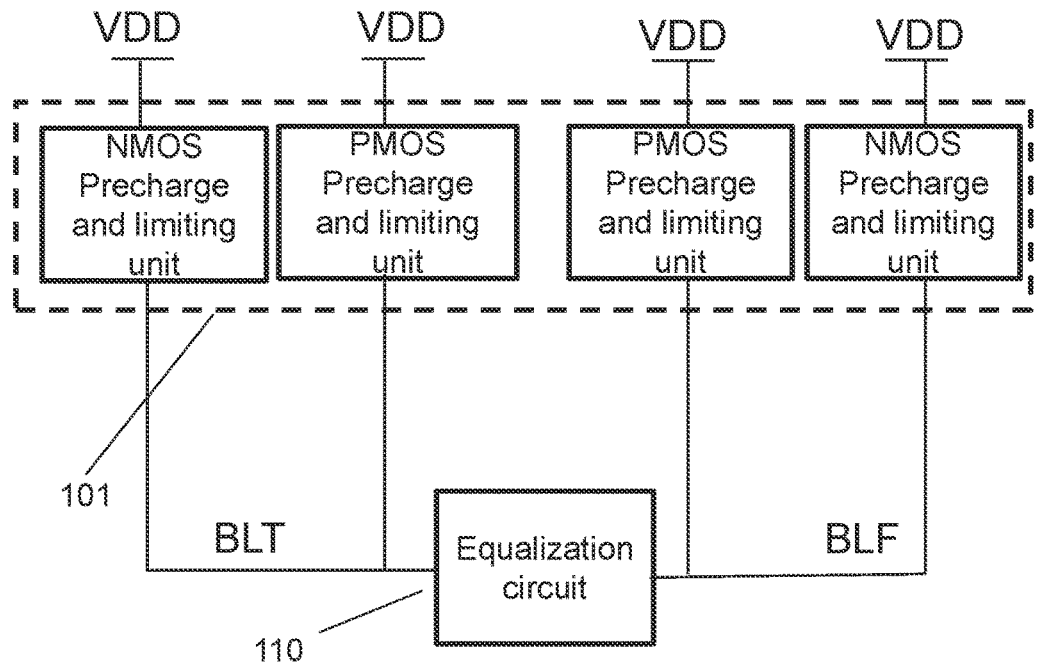
FIG. 8 shows a further embodiment of the presently disclosed precharge circuitry using a mixed PMOS/NMOS implementation.

FIG. 8 shows a further embodiment of the presently disclosed precharge circuitry (100) using a mixed PMOS/NMOS implementation. In this embodiment the precharge and limiting unit (101) is divided into a first NMOS precharge and limiting unit arranged and connected between VDD and a first bit line node (BLT), and a second NMOS precharge and limiting unit arranged and connected between VDD and a second bit line node (BLF). The precharge and limiting unit (101) further comprises a first PMOS precharge and limiting unit arranged and connected between VDD and the first bit line node (BLT), and a second PMOS precharge and limiting unit arranged and connected between VDD and a second bit line node (BLF).

Figure 9:
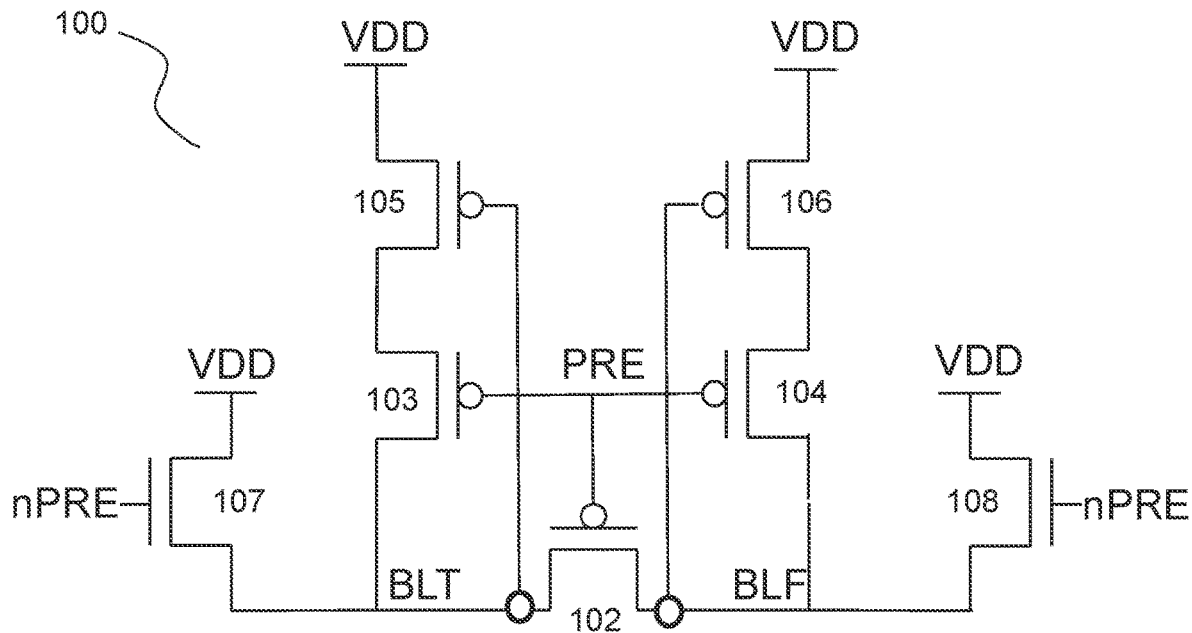
FIG. 9 shows an example of a mixed PMOS/NMOS implementation.

FIG. 9 shows an example of a mixed PMOS/NMOS implementation. In this embodiment, the precharge circuitry (100) comprises a first PMOS transistor (102), a second PMOS transistor (103) and a third PMOS transistor (104). A connection between the first (102) and second (103) PMOS transistors defines a first bit line node (BLT). A connection between the first (102) and third (104) PMOS transistors defines a second bit line node (BLF). A precharge signal (PRE) is connected to the gate terminal of the first (102), second (103) and third (104) PMOS transistors. A fourth PMOS transistor (105) is connected between the second PMOS transistor (103) and a supply voltage (VDD). A fifth PMOS transistor (106) is connected between the third PMOS transistor (104) and the supply voltage (VDD). The gate terminal of the fourth PMOS transistor (105) is connected to the first bit line node (BLT). The gate terminal of the fifth PMOS transistor (106) is connected to the second bit line node (BLF). The precharge circuitry (100) further comprises a sixth (NMOS) transistor (107) and a seventh (NMOS) transistor (108) connected between the bit lines (BLT, BLF) and the supply voltage (VDD). An inverted precharge signal (nPRE) is connected to the gate terminals of the sixth transistor (107) and seventh transistor (108).

Figure 10:
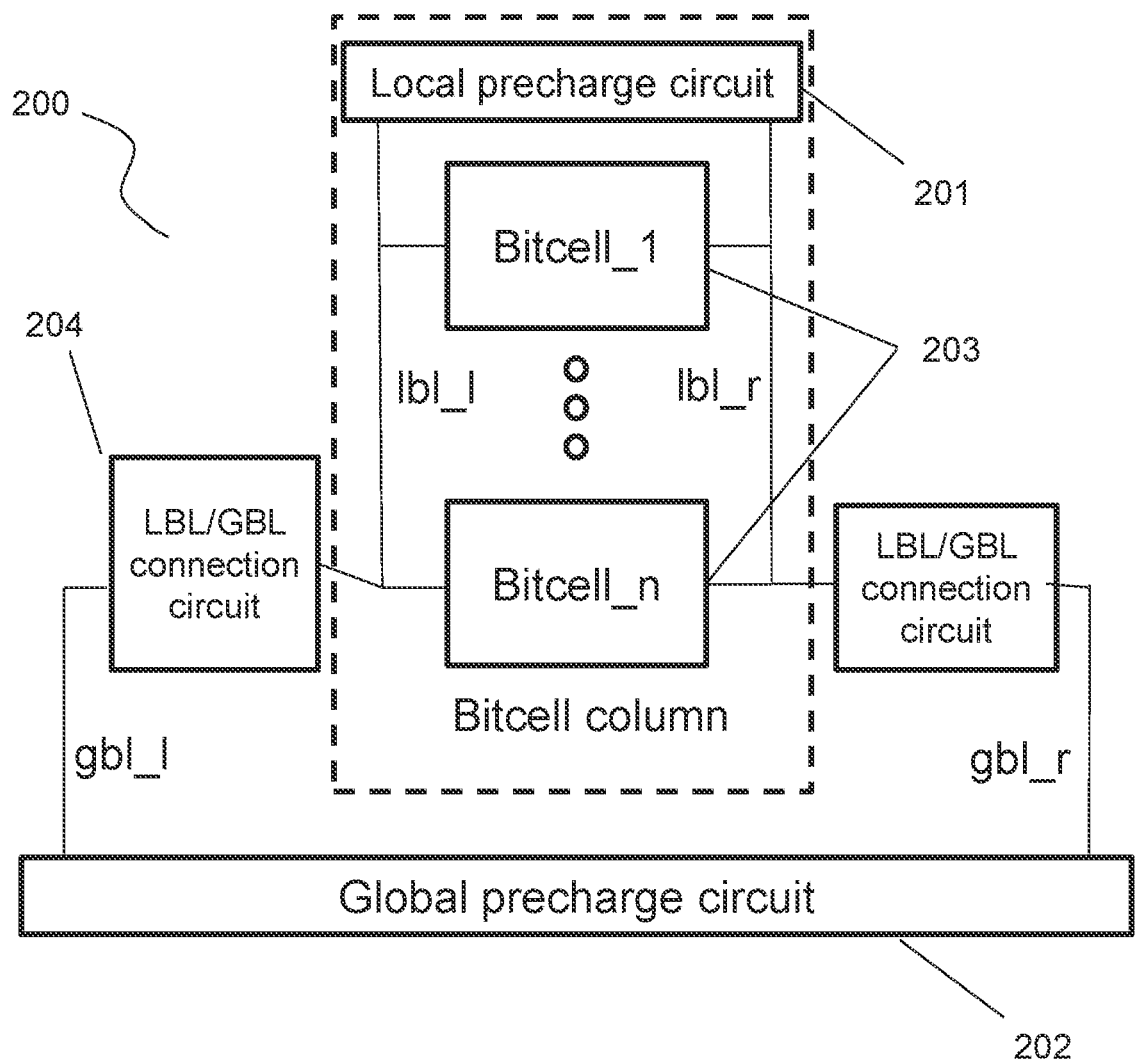
FIG. 10 shows an embodiment of the presently disclosed memory comprising a plurality of memory cells, wherein the memory comprises local and global precharge circuits.

FIG. 10 shows an embodiment of the presently disclosed memory (200) comprising a plurality of memory cells (203), wherein the memory (200) comprises local (201) and global (202) precharge circuits. Switch elements (204) are used to control the connection between the local bit lines (lbl_l, lbl_r) and the global bit lines (gbl_l, gbl_r). In FIG. 11 the switch elements (204) are implemented as NMOS transistors (204).

Figure 12:
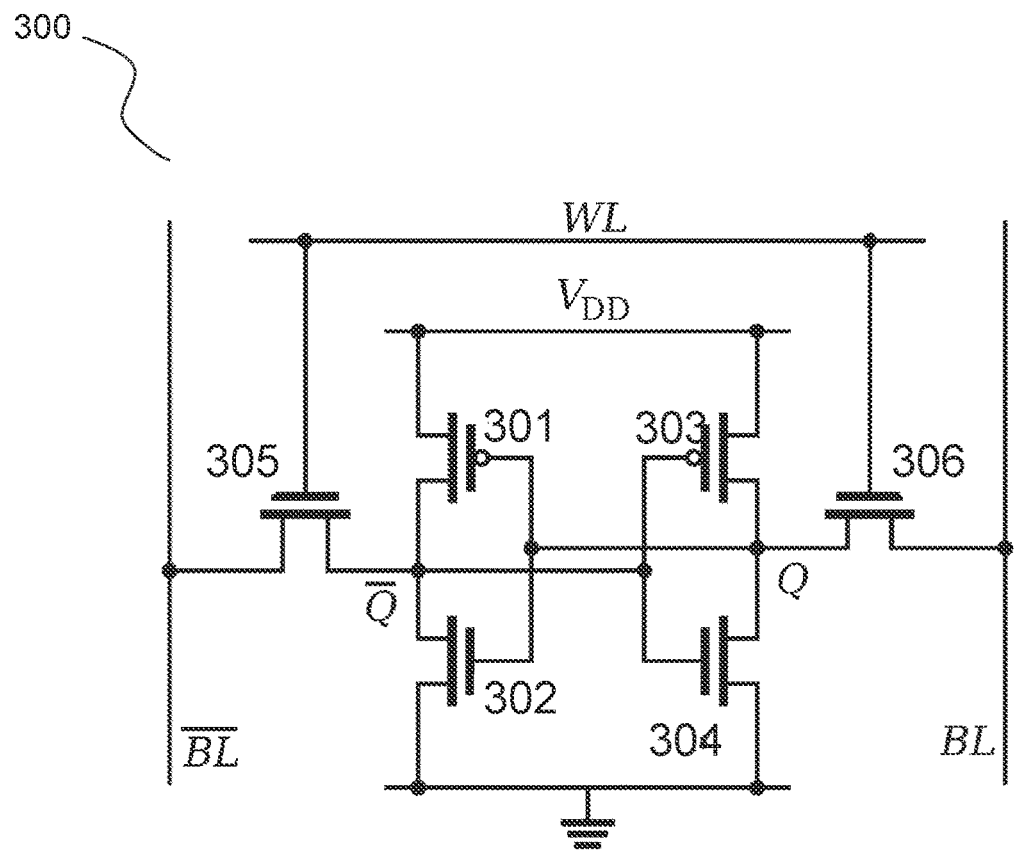
FIG. 12 shows an example of a memory cell.
Figure 13:
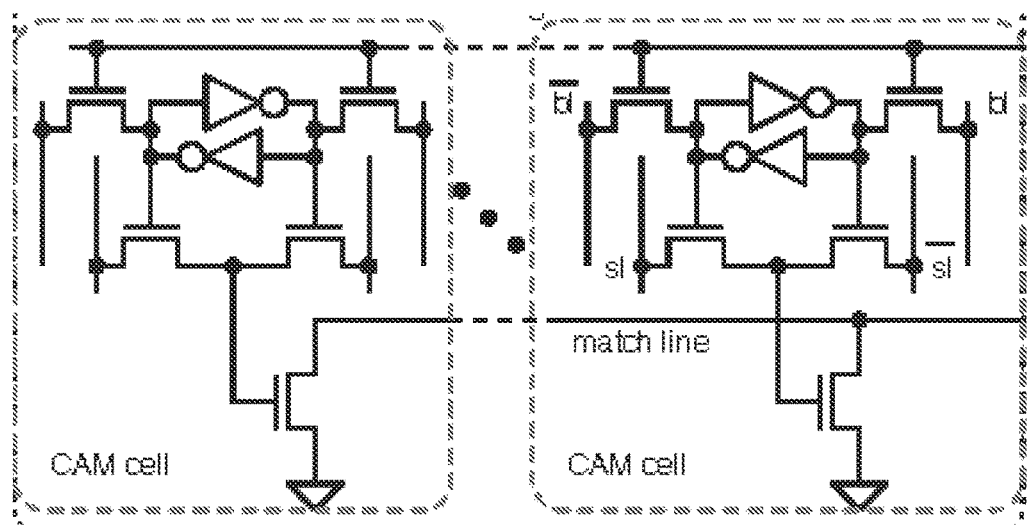
FIG. 13 shows an example of two CAM cells of a CAM segment.
Figure 14:
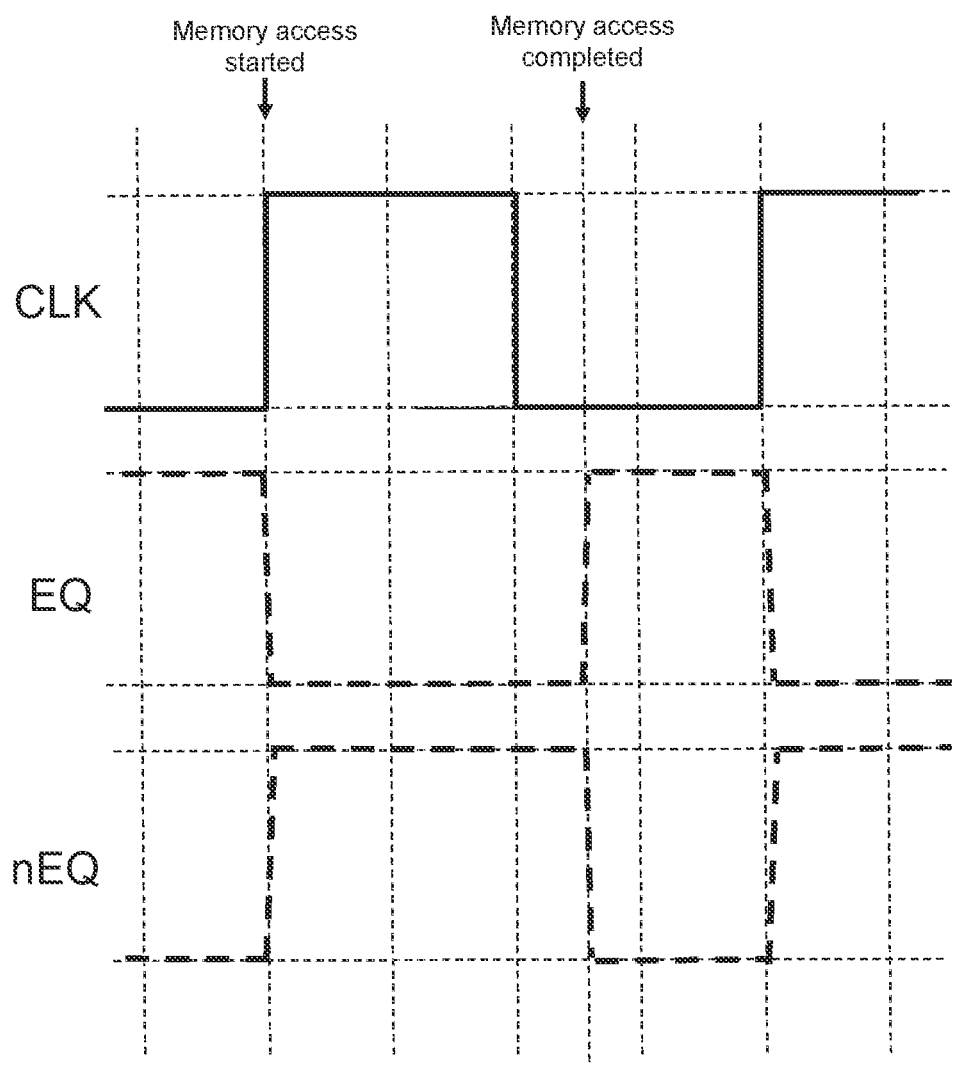
FIG. 14 shows and example of driving of EQ and nEQ signals for the speed and reliability improvements of FIG. 6.

FIG. 12 shows an example of a standard 6T memory cell (300). The presently disclosed memory (200) comprises a plurality of memory cells arranged in columns and rows. The memory cells may be, for example, 6T memory cells but could also be other types of memory cells. In the example of FIG. 12 the memory cell comprises a first memory cell transistor (301), a second memory cell transistor (302), a third memory cell transistor (303) and a fourth memory cell transistor (304) forming first and second cross-coupled inverters defining a first storage node and an inverted first storage node. The memory cell further comprises a fifth memory cell transistor (305) connected between the first storage node and a first bit line and a sixth memory cell transistor (306) connected between the inverted first storage node and a second bit line.

FURTHER DETAILS OF THE INVENTION

1. A precharge circuitry for bit lines of an array of memory cells, the precharge circuitry comprising:
    a precharge and limiting unit configured to precharge a first bit line and a second bit line, the precharge and limiting unit further configured to limit a first bit line precharge level of the first bit line and a second bit line precharge level of the second bit line during a precharge cycle of a read and/or write operation of any of the memory cells,
    wherein the precharge and limiting unit is configured to limit the first bit line precharge level and the second bit line precharge level in a single precharge cycle, preferably without substantial delay.
2. The precharge circuitry according to item 1, wherein the precharge and limiting unit operates at a voltage level equal to a voltage level of the memory cells.
3. The precharge circuitry according to any one of the preceding items, wherein the precharge circuitry is configured to set the first bit line precharge level from a first floating level and the second bit line precharge level from a second floating level directly upon an initiation of the precharge cycle.
4. The precharge circuitry according to any one of the preceding items, wherein a precharge portion comprises:
    a first PMOS transistor having a first gate terminal, a first drain terminal, and a first source terminal;
    a second PMOS transistor having a second gate terminal, a second drain terminal, and a second source terminal;
    and a third PMOS transistor having a third gate terminal, a third drain terminal, and a third source terminal,
    wherein a connection between the first and second PMOS transistors defines a first bit line node connected to the first bit line,
    wherein a connection between the first and third PMOS transistors defines a second bit line node connected to the second bit line, and wherein a precharge signal is connected to the first gate terminal, to the second gate terminal, and to a third gate terminal.
5. The precharge circuitry according to item 4, wherein a limiting portion comprises:
a fourth PMOS transistor having a fourth gate terminal, a fourth drain terminal, and a fourth source terminal, the fourth PMOS connected between the second PMOS transistor and a supply voltage (VDD);
a fifth PMOS transistor having a fifth gate terminal, a fifth drain terminal, and a fifth source terminal; the fifth PMOS connected between the third PMOS transistor and the supply voltage (VDD),
wherein the fourth gate terminal is connected to the first bit line node and the fifth gate terminal is connected to the second bit line node.
6. The precharge circuitry according to item 4, wherein the second PMOS transistor and the third PMOS transistors are connected to a ground reference point (GND).
7. The precharge circuitry according to any one of items 1-3, wherein the precharge circuitry comprises:
a first PMOS transistor having a first gate terminal, a first drain terminal, and a first source terminal;
a second PMOS transistor having a second gate terminal, a second drain terminal, and a second source terminal;
and a third PMOS transistor having a third gate terminal, a third drain terminal, and a third source terminal,
a fourth PMOS transistor having a fourth gate terminal, a fourth drain terminal, and a fourth source terminal, the fourth PMOS connected between the second PMOS transistor and a supply voltage (VDD);
a fifth PMOS transistor having a fifth gate terminal, a fifth drain terminal, and a fifth source terminal; the fifth PMOS connected between the third PMOS transistor and the supply voltage (VDD),
wherein a connection between the first and second PMOS transistors defines a first bit line node connected to the first bit line,
wherein a connection between the first and third PMOS transistors defines a second bit line node connected to the second bit line, and
wherein a precharge signal is connected to the first gate terminal, to the fourth gate terminal, and to the fifth gate terminal.
8. The precharge circuitry according to item 7, wherein the second gate terminal is connected to the first bit line node and the third gate terminal is connected to the second bit line node.
9. The precharge circuitry according to any one of items 5-8, wherein the fourth PMOS transistor and fifth PMOS transistor are dimensioned such the first bit line precharge level and the second bit line precharge level are limited compared to the supply voltage (VDD) and/or wherein a transistor type of the fourth PMOS transistor and fifth PMOS transistor are selected such the first bit line precharge level and the second bit line precharge level are limited compared to the supply voltage (VDD).
10. The precharge circuitry according to any one of items 1-3, wherein a precharge portion comprises:
a first NMOS transistor having a first gate terminal, a first drain terminal, and a first source terminal;
a second NMOS transistor having a second gate terminal, a second drain terminal, and a second source terminal;
and a third NMOS transistor having a third gate terminal, a third drain terminal, and a third source terminal,
wherein a connection between the first and second NMOS transistors defines a first bit line node connected to the first bit line,
wherein a connection between the first and third NMOS transistors defines a second bit line node connected to the second bit line, and
wherein a precharge signal is connected to the first gate terminal, to the second gate terminal, and to a third gate terminal.
11. The precharge circuitry according to item 10, wherein a limiting portion comprises:
a fourth NMOS transistor having a fourth gate terminal, a fourth drain terminal, and a fourth source terminal, the fourth NMOS connected between the second NMOS transistor and a ground reference point (GND);
a fifth NMOS transistor having a fifth gate terminal, a fifth drain terminal, and a fifth source terminal; the fifth NMOS connected between the third NMOS transistor and the ground reference point (GND),
wherein the fourth gate terminal is connected to the first bit line node and the fifth gate terminal is connected to the second bit line node.
12. The precharge circuitry according to any one of items 1-3, wherein the precharge circuitry comprises:
a first NMOS transistor having a first gate terminal, a first drain terminal, and a first source terminal;
a second NMOS transistor having a second gate terminal, a second drain terminal, and a second source terminal;
and a third NMOS transistor having a third gate terminal, a third drain terminal, and a third source terminal,
a fourth NMOS transistor having a fourth gate terminal, a fourth drain terminal, and a fourth source terminal, the fourth NMOS connected between the second NMOS transistor and a ground reference point (GND);
a fifth NMOS transistor having a fifth gate terminal, a fifth drain terminal, and a fifth source terminal; the fifth NMOS connected between the third NMOS transistor and the ground reference point (GND),
wherein a connection between the first and second NMOS transistors define a first bit line node connected to the first bit line,
wherein a connection between the first and third NMOS transistors define a second bit line node connected to the second bit line, and
wherein a precharge signal is connected to the first gate terminal, to the fourth gate terminal, and to the fifth gate terminal.
13. The precharge circuitry according to item 12, wherein the second gate terminal is connected to the first bit line node and the third gate terminal is connected to the second bit line node.
14. The precharge circuitry according to any one of items 11-13, wherein the fourth NMOS transistor and fifth NMOS transistor are dimensioned such the first bit line precharge level and the second bit line precharge level are higher than the ground reference point (GND).

15. The precharge circuitry according to any one of the preceding items, wherein the first bit line precharge level and second bit line precharge level are 10-50% lower than the supply voltage (VDD), preferably wherein the first bit line precharge level and second bit line precharge level are 20-40% lower than the supply voltage (VDD).

16. The precharge circuitry according to any one of the preceding items, comprising an equalization circuit connected between the first bit line and the second bit line.

17. The precharge circuitry according to item 16, wherein the equalization circuit comprises an equalizer NMOS transistor or an equalizer PMOS transistor connected between the first bit line and the second bit line, wherein the precharge signal is connected to the gate terminal of the equalizer NMOS transistor or equalizer PMOS transistor.

18. The precharge circuitry according to item 16, wherein the equalization circuit comprises an equalizer NMOS transistor and an equalizer PMOS transistor connected in parallel, wherein the equalizer NMOS transistor and equalizer PMOS transistor are connected between the first bit line and the second bit line.

19. The precharge circuitry according to any one of the preceding items, wherein the first bit line is a 'true' bit line and the second bit line is a 'false' bit line of a column of the array of memory cells.

20. A memory, such as a static random access memory, comprising:
    a plurality of memory cells arranged in columns and rows, each memory cell comprising an arrangement of memory cell transistors defining a first storage node and an inverted first storage node accessed from a first bit line and a second bit line;
    at least one precharge circuit, wherein the precharge circuit is connected to the first bit line and the second bit line within a column, wherein each precharge circuit is configured to limit the first bit line to a first bit line precharge level and the second bit line to a second bit line precharge level during a precharge cycle.

21. The memory according to item 20, wherein the arrangement of memory cell transistors comprises:
    a first memory cell transistor, a second memory cell transistor, a third memory cell transistor and a fourth memory cell transistor forming first and second cross-coupled inverters defining the first storage node and the inverted first storage node;
    a fifth memory cell transistor connected between the first storage node and the first bit line; and/or a sixth transistor connected between the inverted first storage node and the second bit line.

22. The memory according to any one of items 20-21, wherein the precharge circuit comprises:
    a precharge and limiting unit configured to precharge the first bit line and the second bit line, further configured to limit a first bit line precharge level of the first bit line and a second bit line precharge level of the second bit line during a precharge cycle of a read and/or write operation of any of the memory cells,
    wherein the precharge and limiting unit is configured to limit the first bit line precharge level and the second bit line precharge level in a single precharge cycle, preferably without substantial delay.

23. The memory according to any one of items 20-22, wherein the precharge circuit is the precharge circuit according to any one of items 1-19.

24. The memory according to any one of items 20-23, further comprising:
    a row decoder;
    a column decoder;
    sense amplifiers.

25. The memory according to any one of items 20-24, wherein the memory is a static random access memory or a content-addressable memory or a ternary content-addressable memory.

26. The memory according to any one of items 20-25, wherein memory cells arranged in each column are connected to a first local bit line and a second local bit line, wherein at least one local precharge circuit is connected to each local bit line, and wherein a global first bit line can be configured to be connected to any first local bit line and a global second bit line can be configured to be connected to any second local bit line, wherein a global precharge circuit is connected to the global first bit line and global second bit line.

27. The memory according to item 26, wherein the local bit lines and the global bit lines are separated by switch elements, such as NMOS transistors.

28. The memory according to any one of items 26-27, wherein the global precharge circuit is configured to precharge the bit lines to a precharge level 10-50% lower than a supply voltage level (VDD), and the local precharge circuit is configured to precharge the bit lines to the supply voltage level.

29. A precharge circuitry for matchlines of an array of memory cells, the precharge circuitry comprising:
    a precharge and limiting unit configured to precharge a matchline, the precharge and limiting unit further configured to limit a matchline precharge level of the matchline during a precharge cycle of a read and/or write operation of any of the memory cells,
    wherein the precharge and limiting unit is configured to limit the matchline precharge level a single precharge cycle, preferably without substantial delay.

30. A precharge circuitry for bit lines of an array of memory cells, the precharge circuitry comprising:
    a precharge and limiting unit configured to precharge a first bit line, the precharge and limiting unit further configured to limit a first bit line precharge level of the first bit line during a precharge cycle of a read and/or write operation of any of the memory cells,
    wherein the precharge and limiting unit is configured to limit the first bit line precharge level in a single precharge cycle, preferably without substantial delay.

The invention claimed is:

1. A precharge circuitry for bit lines of an array of memory cells,
    the precharge circuitry comprising:
    a precharge and limiting unit configured to precharge a first bit line and a second bit line, the precharge and limiting unit further configured to limit a first bit line precharge level of the first bit line and a second bit line precharge level of the second bit line during a precharge cycle of a read and/or write operation of any of the memory cells,
    wherein the precharge and limiting unit is configured to limit the first bit line precharge level and the second bit line precharge level in a single precharge cycle, preferably without substantial delay, and wherein the precharge circuitry comprises a PMOS transistor based or NMOS transistor based precharge portion configured to precharge the first bit line and the second bit line, and a PMOS transistor based or NMOS transistor based limiting portion configured to limit the first bit line precharge level and the second bit line precharge level relative to a supply voltage (VDD) or ground reference level (GND) without substantial delay by short-circuiting the first bit line to a first limited precharge level node of the PMOS transistor based on NMOS transistor based limiting portion, and by short-circuiting the second bit line to a second limited precharge level node of the PMOS transistor based or NMOS transistor based limiting portion.

2. The precharge circuitry according to claim 1, wherein the precharge circuitry is configured to set the first bit line precharge level from a first floating level and the second bit line precharge level from a second floating level directly upon an initiation of the precharge cycle.

3. The precharge circuitry according to claim 1, wherein a precharge portion comprises:
a first PMOS transistor having a first gate terminal, a first drain terminal, and a first source terminal;
a second PMOS transistor having a second gate terminal, a second drain terminal, and a second source terminal; and a third PMOS transistor having a third gate terminal, a third drain terminal, and a third source terminal,
wherein a connection between the first and second PMOS transistors defines a first bit line node connected to the first bit line,
wherein a connection between the first and third PMOS transistors defines a second bit line node connected to the second bit line, and
wherein a precharge signal is connected to the first gate terminal, to the second gate terminal, and to a third gate terminal,
and wherein a limiting portion comprises:
a fourth PMOS transistor having a fourth gate terminal, a fourth drain terminal, and a fourth source terminal, the fourth PMOS connected between the second PMOS transistor and a supply voltage (VDD);
a fifth PMOS transistor having a fifth gate terminal, a fifth drain terminal, and a fifth source terminal; the fifth PMOS connected between the third PMOS transistor and the supply voltage (VDD),
wherein the fourth gate terminal is connected to the first bit line node and the fifth gate terminal is connected to the second bit line node.

4. The precharge circuitry according to claim 3, wherein the fourth PMOS transistor and fifth PMOS transistor are dimensioned such the first bit line precharge level and the second bit line precharge level are limited compared to the supply voltage (VDD) and/or wherein a transistor type of the fourth PMOS transistor and fifth PMOS transistor are selected such the first bit line precharge level and the second bit line precharge level are limited compared to the supply voltage (VDD).

5. The precharge circuitry according to claim 1, wherein the precharge circuitry comprises:
a first PMOS transistor having a first gate terminal, a first drain terminal, and a first source terminal;
a second PMOS transistor having a second gate terminal, a second drain terminal, and a second source terminal;
and a third PMOS transistor having a third gate terminal, a third drain terminal, and a third source terminal,
a fourth PMOS transistor having a fourth gate terminal, a fourth drain terminal, and a fourth source terminal, the fourth PMOS connected between the second PMOS transistor and a supply voltage (VDD);
a fifth PMOS transistor having a fifth gate terminal, a fifth drain terminal, and a fifth source terminal; the fifth PMOS connected between the third PMOS transistor and the supply voltage (VDD),
wherein a connection between the first and second PMOS transistors defines a first bit line node connected to the first bit line,
wherein a connection between the first and third PMOS transistors defines a second bit line node connected to the second bit line, and
wherein a precharge signal is connected to the first gate terminal, to the fourth gate terminal, and to the fifth gate terminal,
wherein the second gate terminal is connected to the first bit line node and the third gate terminal is connected to the second bit line node.

6. The precharge circuitry according to claim 5, wherein the fourth PMOS transistor and fifth PMOS transistor are dimensioned such the first bit line precharge level and the second bit line precharge level are limited compared to the supply voltage (VDD) and/or wherein a transistor type of the fourth PMOS transistor and fifth PMOS transistor are selected such the first bit line precharge level and the second bit line precharge level are limited compared to the supply voltage (VDD).

7. The precharge circuitry according to claim 1, wherein a precharge portion comprises:
a first NMOS transistor having a first gate terminal, a first drain terminal, and a first source terminal;
a second NMOS transistor having a second gate terminal, a second drain terminal, and a second source terminal;
and a third NMOS transistor having a third gate terminal, a third drain terminal, and a third source terminal,
wherein a connection between the first and second NMOS transistors defines a first bit line node connected to the first bit line,
wherein a connection between the first and third NMOS transistors defines a second bit line node connected to the second bit line, and
wherein a precharge signal is connected to the first gate terminal, to the second gate terminal, and to a third gate terminal, and
wherein a limiting portion comprises:
a fourth NMOS transistor having a fourth gate terminal, a fourth drain terminal, and a fourth source terminal, the fourth NMOS connected between the second NMOS transistor and a ground reference point (GND);
a fifth NMOS transistor having a fifth gate terminal, a fifth drain terminal, and a fifth source terminal; the fifth NMOS connected between the third NMOS transistor and the ground reference point (GND),
wherein the fourth gate terminal is connected to the first bit line node and the fifth gate terminal is connected to the second bit line node.

8. The precharge circuitry according to claim 7, wherein the fourth NMOS transistor and fifth NMOS transistor are dimensioned such the first bit line precharge level and the second bit line precharge level are higher than the ground reference point (GND) and/or wherein the fourth NMOS transistor and fifth NMOS transistor are selected such the first bit line precharge level and the second bit line precharge level are higher than the ground reference point (GND).

9. The precharge circuitry according to claim 1, wherein the precharge circuitry comprises:

a first NMOS transistor having a first gate terminal, a first drain terminal, and a first source terminal;
a second NMOS transistor having a second gate terminal, a second drain terminal, and a second source terminal;
and a third NMOS transistor having a third gate terminal, a third drain terminal, and a third source terminal,
a fourth NMOS transistor having a fourth gate terminal, a fourth drain terminal, and a fourth source terminal, the fourth NMOS connected between the second NMOS transistor and a ground reference point (GND);
a fifth NMOS transistor having a fifth gate terminal, a fifth drain terminal, and a fifth source terminal; the fifth NMOS connected between the third NMOS transistor and the ground reference point (GND),
wherein a connection between the first and second NMOS transistors defines a first bit line node connected to the first bit line,
wherein a connection between the first and third NMOS transistors defines a second bit line node connected to the second bit line, and
wherein a precharge signal is connected to the first gate terminal, to the fourth gate terminal, and to the fifth gate terminal,
wherein the second gate terminal is connected to the first bit line node and the third gate terminal is connected to the second bit line node.

10. The precharge circuitry according to claim 9, wherein the fourth NMOS transistor and fifth NMOS transistor are dimensioned such the first bit line precharge level and the second bit line precharge level are higher than the ground reference point (GND) and/or wherein the fourth NMOS transistor and fifth NMOS transistor are selected such that the first bit line precharge level and the second bit line precharge level are higher than the ground reference point (GND).

11. The precharge circuitry according to claim 1, wherein the precharge circuitry comprises:
a first NMOS transistor having a first gate terminal, a first drain terminal, and a first source terminal;
a second NMOS transistor having a second gate terminal, a second drain terminal, and a second source terminal;
and a third NMOS transistor having a third gate terminal, a third drain terminal, and a third source terminal,
wherein a connection between the first and second NMOS transistors defines a first bit line node connected to the first bit line,
wherein a connection between the first and third NMOS transistors defines a second bit line node connected to the second bit line, and
wherein a precharge signal is connected to the first gate terminal, to the second gate terminal, and to the third gate terminal.

12. The precharge circuitry according to claim 1, wherein the first bit line precharge level and second bit line precharge level are 10-80% lower than the supply voltage (VDD), preferably wherein the first bit line precharge level and second bit line precharge level are 20-80% lower than the supply voltage (VDD), even more preferably wherein the first bit line precharge level and second bit line precharge level are 20-70% lower than the supply voltage (VDD).

13. A memory comprising:
a plurality of memory cells arranged in columns and rows, each memory cell comprising an arrangement of memory cell transistors defining a first storage node and an inverted first storage node accessed from a first bit line and a second bit line; and
at least one precharge circuit, wherein the precharge circuit is connected to the first bit line and the second bit line within a column, wherein each precharge circuit is configured to limit the first bit line to a first bit line precharge level and the second bit line to a second bit line precharge level during a precharge cycle,
wherein the precharge circuit comprises a PMOS transistor based or NMOS transistor based precharge portion configured to precharge the first bit line and the second bit line; and a PMOS transistor based or NMOS transistor based limiting portion configured to limit the first bit line precharge level and the second bit line precharge level relative to a supply voltage (VDD) or ground reference level (GND) without substantial delay by short-circuiting the first bit line to a first limited precharge level node of the PMOS transistor based or NMOS transistor based limiting portion, and by short-circuiting the second bit line to a second limited precharge level node of the PMOS transistor based or NMOS transistor based limiting portion.

14. The memory according to claim 13, wherein the precharge circuit comprises:
a precharge and limiting unit configured to precharge the first bit line and the second bit line, further configured to limit a first bit line precharge level of the first bit line and a second bit line precharge level of the second bit line during a precharge cycle of a read and/or write operation of any of the memory cells,
wherein the precharge and limiting unit is configured to limit the first bit line precharge level and the second bit line precharge level in a single precharge cycle, preferably without substantial delay.

15. The memory according to claim 13, wherein memory cells arranged in each column are connected to a first local bit line and a second local bit line, wherein at least one local precharge circuit is connected to each local bit line, and wherein a global first bit line can be configured to be connected to any first local bit line and a global second bit line can be configured to be connected to any second local bit line, wherein a global precharge circuit is connected to the global first bit line and global second bit line, wherein the local bit lines and the global bit lines are separated by switch elements.

16. The memory according to claim 15, wherein the global precharge circuit is configured to precharge the bit lines to a precharge level 10-50% lower than a supply voltage level (VDD), and the local precharge circuit is configured to precharge the bit lines to the supply voltage level.

17. A precharge circuitry for bit lines of an array of memory cells, the precharge circuitry comprising:
a precharge and limiting unit configured to precharge a first bit line and a second bit line, the precharge and limiting unit further configured to limit a first bit line precharge level of the first bit line and a second bit line precharge level of the second bit line during a precharge cycle of a read and/or write operation of any of the memory cells,
wherein the precharge and limiting unit is configured to limit the first bit line precharge level and the second bit line precharge level in a single precharge cycle, preferably without substantial delay,
wherein the precharge circuitry comprises:
a first PMOS transistor, a second PMOS transistor, and a third PMOS transistor, the first, second, and third PMOS transistors being connected in series to provide a precharge portion;

a fourth PMOS transistor and a fifth PMOS transistor connected between the precharge portion and a supply voltage (VDD) to provide a limiting portion, wherein the first bit line is connected to either a fourth gate terminal of the fourth PMOS transistor or to a second gate terminal of the second PMOS transistor, thereby limiting the first bit line precharge level, and wherein the second bit line is connected to either a fifth gate terminal of the fifth PMOS transistor or to a third gate terminal of the third PMOS transistor, thereby limiting the second bit line precharge level.

18. A precharge circuitry for bit lines of an array of memory cells, the precharge circuitry comprising:

a precharge and limiting unit configured to precharge a first bit line and a second bit line, the precharge and limiting unit further configured to limit a first bit line precharge level of the first bit line and a second bit line precharge level of the second bit line during a precharge cycle of a read and/or write operation of any of the memory cells, wherein the precharge and limiting unit is configured to limit the first bit line precharge level and the second bit line precharge level in a single precharge cycle, preferably without substantial delay, wherein the precharge circuitry comprises:

a first NMOS transistor, a second NMOS transistor, and a third NMOS transistor, the first, second, and third NMOS transistors being connected in series to provide a precharge portion;

a fourth NMOS transistor and a fifth NMOS transistor connected between the precharge portion and a ground reference point (GND) to provide a limiting portion relative to the ground reference point, wherein the first bit line is connected to either a fourth gate terminal of the fourth NMOS transistor or to a second gate terminal of the second NMOS transistor, thereby limiting the first bit line precharge level relative to the ground reference point, and wherein the second bit line is connected to either a fifth gate terminal of the fifth NMOS transistor or to a third gate terminal of the third NMOS transistor, thereby limiting the second bit line precharge level relative to the ground reference point.

19. A precharge circuitry for bit lines of an array of memory cells, the precharge circuitry comprising:

a precharge and limiting unit configured to precharge a first bit line and a second bit line, the precharge and limiting unit further configured to limit a first bit line precharge level of the first bit line and a second bit line precharge level of the second bit line during a precharge cycle of a read and/or write operation of any of the memory cells, wherein the precharge and limiting unit is configured to limit the first bit line precharge level and the second bit line precharge level in a single precharge cycle, preferably without substantial delay, wherein the precharge circuitry comprises:

a first NMOS transistor having a first gate terminal, a first drain terminal, and a first source terminal;

a second NMOS transistor having a second gate terminal, a second drain terminal, and a second source terminal;

and a third NMOS transistor having a third gate terminal, a third drain terminal, and a third source terminal, wherein a connection between the first and second NMOS transistors defines a first bit line node connected to the first bit line, wherein a connection between the first and third NMOS transistors defines a second bit line node connected to the second bit line, and wherein a precharge signal is connected to the first gate terminal, to the second gate terminal, and to the third gate terminal, wherein said first, second, and third NMOS transistors are dimensioned such that the first bit line precharge level and the second bit line precharge level are limited compared to a supply voltage, wherein the first bit line precharge level and the second bit line precharge level are 10-80% lower than the supply voltage.

* * * * *